US 6,625,792 B1

(12) United States Patent
Yamasaki

(10) Patent No.: US 6,625,792 B1
(45) Date of Patent: Sep. 23, 2003

(54) SEMICONDUCTOR DESIGN SYSTEM, SEMICONDUCTOR INTEGRATED CIRCUIT, SEMICONDUCTOR DESIGN METHOD AND STORAGE MEDIUM STORING SEMICONDUCTOR DESIGN PROGRAM

(75) Inventor: Kazuhito Yamasaki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 126 days.

(21) Appl. No.: 09/620,471

(22) Filed: Jul. 20, 2000

(30) Foreign Application Priority Data

Aug. 4, 1999 (JP) .......................................... 11-221338

(51) Int. Cl.[7] .............................................. G06F 17/50
(52) U.S. Cl. .............................. 716/11; 716/8; 716/18
(58) Field of Search ................................... 716/8–14, 7

(56) References Cited

U.S. PATENT DOCUMENTS

| | | | | |
|---|---|---|---|---|
| 5,537,332 A | * | 7/1996 | Bolliger et al. | 364/490 |
| 5,731,985 A | * | 3/1998 | Gupta et al. | 364/491 |
| 5,793,644 A | * | 8/1998 | Koford et al. | 364/491 |
| 5,808,901 A | * | 9/1998 | Cheng et al. | 364/491 |
| 5,930,147 A | * | 7/1999 | Takei | 364/488 |
| 6,286,128 B1 | * | 9/2001 | Pileggi et al. | 716/18 |

OTHER PUBLICATIONS

Su et al, "A Timing–Driven Soft–Macro Placement and Resynthesis Metehod in Interaction with Chip Floorplanning," IEEE, Apr. 1999, pp. 475–483.*

* cited by examiner

Primary Examiner—Vuthe Siek
(74) Attorney, Agent, or Firm—Staas & Halsey LLP

(57) ABSTRACT

A semiconductor design system enhances layout on a semiconductor chip. Module layout positions of an integrated circuit chip are determined based on design information including information for connecting external circuits and modules information for connecting modules, macro information, and chip information. Before initiating detailed layout design of the chip, namely, in a stage where chip specifications are determined and before generation of an RTL description, accurate layout position information of modules are obtained. A determining unit determines a layout position of a module based on design information of information for connecting an external circuit to the module and information for interconnecting the module to other modules, macro information corresponding to a macro within the module and chip information corresponding to the semiconductor chip. A module moving unit moves the module having the associated macro to an area near a side of the semiconductor chip. The design information further has information about a size of the module, and the module layout position is determined by considering the size of the module.

32 Claims, 30 Drawing Sheets

MACRO LAYOUT

EFFECT OF THE INVENTION

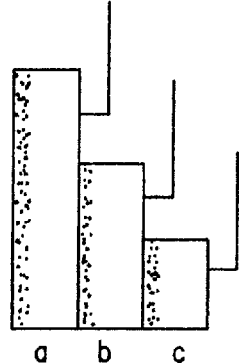
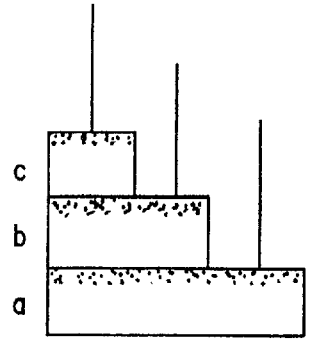
FIG. 15A  FIG. 15B
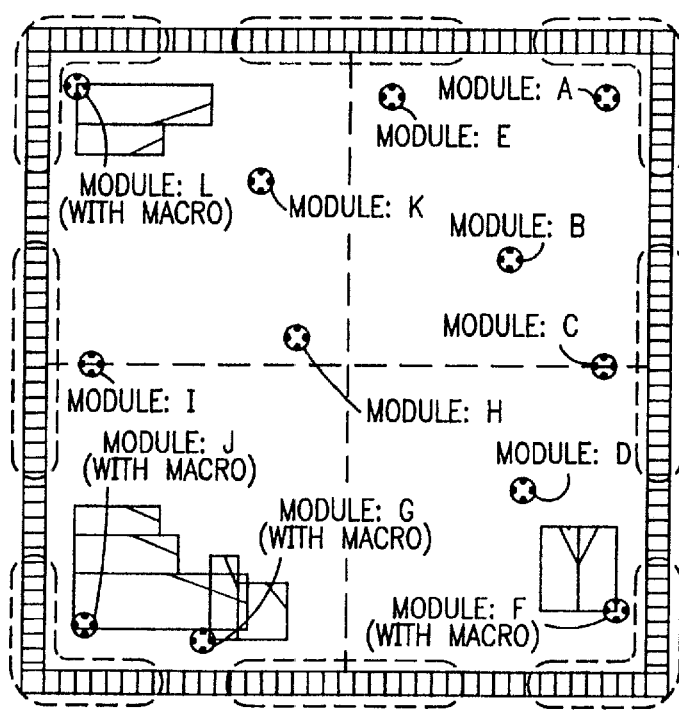
FIG. 15C

MACRO MOVEMENT ④-1
▭ : POWER SUPPLY WIRING
MACRO MOVEMENT ④-1
▭ : POWER SUPPLY WIRING
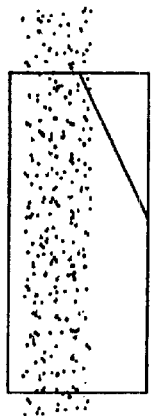  
FIG. 22A          FIG. 22B
MACRO MOVEMENT ④-1
▭ : POWER SUPPLY WIRING
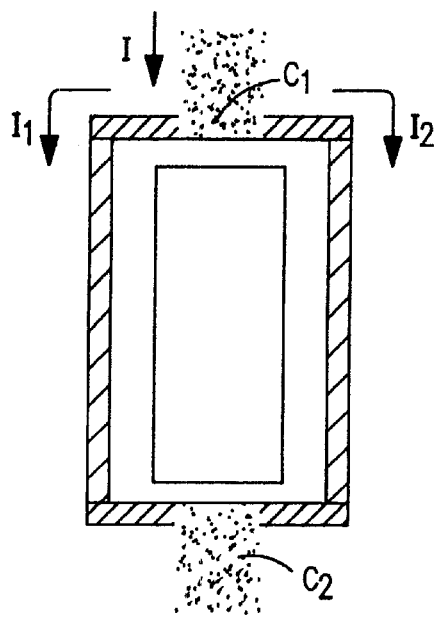
FIG. 22C MACRO MOVEMENT ④-3
▭ : POWER SUPPLY WIRING
MACRO MOVEMENT ④-3
▭ : POWER SUPPLY WIRING
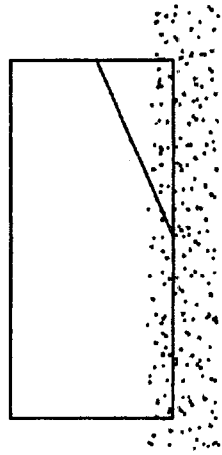
FIG. 24A
FIG. 24B
MACRO MOVEMENT ④-3
▭ : POWER SUPPLY WIRING
MACRO MOVEMENT ④-3
▭ : POWER SUPPLY WIRING
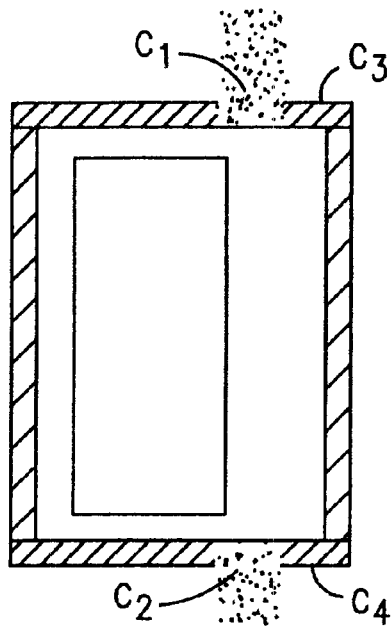
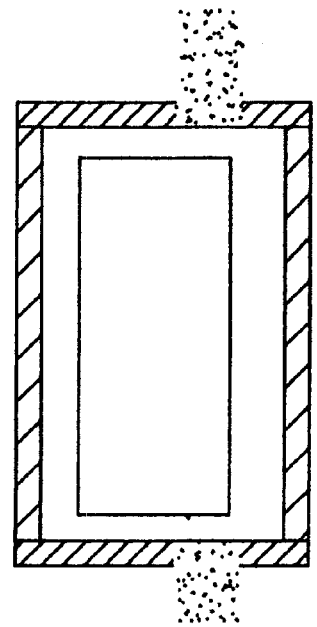
FIG. 24C
FIG. 24D

SHAPE CONVERSION

SHAPE CONVERSION

SHAPE CONVERSION

SEMICONDUCTOR DESIGN SYSTEM, SEMICONDUCTOR INTEGRATED CIRCUIT, SEMICONDUCTOR DESIGN METHOD AND STORAGE MEDIUM STORING SEMICONDUCTOR DESIGN PROGRAM

CROSS-REFERENCE TO RELATED APPLICATION

This application claims the benefit of Japanese Patent Application No. 11-221338, which was filed in the Japanese Patent Office on Aug. 4, 1999, and which is incorporated herein by reference.

BACKGROUND OF THE INVENTION

The present invention relates to a large-scale integration ("LSI") design system, and to an LSI design system utilizing Computer Aided Design ("CAD"). More particularly, the present invention relates to a system, circuit and method for enhancing macro and module layout with respect to power supply wiring on an LSI semiconductor chip using CAD.

In the design process of a semiconductor chip, and after the specifications of the semiconductor chip are determined, division to a plurality of modules is performed on the basis of the determined specifications. Modules, i.e. module units, are then blocked to realize predetermined functions. Modules include macros such as RAM, ROM, CPU, etc., and unit cells such as AND gates, OR gates, flip-flops ("FF"), etc. The semiconductor chip is therefore comprised of these modules.

As illustrated, FIG. 32 provides an illustration of a problem to be solved by the present invention and an effect of the present invention. Flow of a design process of a semiconductor chip is first explained. A module group is generated from specifications 100 of a semiconductor chip. The specifications 100 are described in a Register Transfer Level ("RTL") description in an operation level logical circuit 101. Thereafter, function and logical design is performed.

The RTL description in operation level logical circuit 101 is converted to a net list (gate level logical circuit) 103 by logical synthetic 102. Next, a physical design is performed on a module group, which has been converted to the net list. The module group is physically arranged on the semiconductor chip based on the net list 103 by way of layout unit 104. The layout unit 104 also performs layout wiring.

A problem occurs when a module including macros is arranged at an area near the center of a semiconductor chip. That is, because a macro is very large compared to an individual unit cell, and because wiring cannot pass through the macro, wiring must be made through an alternative route to avoid conflicts. Wiring efficiency is then lowered.

Therefore, when layout of a module is completed, the layout distribution of modules must be checked. This layout distribution check is performed in some cases by a method such as simulation, but is often performed visually for the result of actual layout of the net list. If some problems occur in the layout distribution of modules, a design process must be repeated from the stage of function and logical design in view of modifying layout distribution of modules. In some cases, the RTL description itself must be described again.

As explained above, in the related art, a discrepancy in layout of modules and macros is detected for the first time in the process of a physical design stage. Therefore the design process must be returned to the function and logical design stage for re-arrangement. This process results in a long term process for semiconductor design because of the need for repeated design processes. In the future, design process time will increase in response to an expected increase in the number of modules and an enlargement in circuit scale. Moreover, a new problem will be presented in that reliability will be lowered because of an increased possibility of miscalculation of available chip area. Further, predictability of a chip design price will be compromised due to miscalculation of available chip area.

BRIEF SUMMARY OF THE INVENTION

According to the present semiconductor design system, accurate module layout position information is obtained in a stage where the specifications are determined, i.e. before entering the function and logical design stage for the chip. Repetition of design can also be avoided by suppressing generation of problems in the subsequent function, logical design and physical design stages.

FIG. 32 illustrates an effect of the present invention. Before starting a detailed chip design, namely in the stage where the specifications 100 are determined (i.e., in the stage before generation of the RTL description), accurate layout position information of modules can be obtained. Therefore, because chip area and chip price can be estimated quickly and accurately, quick correspondence can be made to customers. Moreover, because subsequent design may be performed based on the accurate layout position of modules, repetition of a design process can be avoided due to suppression of design problems.

When module size, i.e. a number of areas, is included in the specifications, the layout position information of a module considering module size, can be obtained. Therefore, more accurate estimation of chip area and chip price can be obtained. Likewise, when module size is included in the specifications, the terminal position information of a module can also be obtained. Therefore, a highly accurate layout wiring process can be performed. A module, including macros, can be arranged along a side of a semiconductor chip and wiring efficiency and chip integration density can also be improved.

A semiconductor design system enhances layout on a semiconductor chip with a determining unit determining a layout position of a module on a semiconductor chip based on design information comprising information for connecting an external circuit to the module and information for interconnecting the module to other modules, macro information corresponding to a macro within the module and chip information corresponding to the semiconductor chip. A module moving unit moves the module having the associated macro to an area near a side of the semiconductor chip. The design information further includes information about a size of the module, and the module layout position is determined by considering the size of the module.

In a semiconductor design system according to the present invention, an input/output pad of a semiconductor chip is divided into a plurality of pad allocation areas, and a determining unit generates information of a terminal position for connecting modules on the semiconductor chip. Macros included in a module are allocated with a longest side length macro disposed toward a side of the semiconductor chip and remaining macros sequentially disposed toward chip center in order of macro length. Further, the chip is divided into four areas, with each area having an associated corner of the chip, and wherein the module having the longest sided macro among the modules in each area is allocated at a corresponding corner of the chip. The same type of macros within a module are disposed with signal terminals opposed to each other when arranged adjacently.

A semiconductor design system has a module initial layout unit allocating a module to an initial predetermined position on a semiconductor chip, a first module moving unit moving the module to an area closer to a pad allocating area of a plurality of pad allocation areas based on information for connecting an external circuit and the module, a second module moving unit moving the module based on information of connecting the module with a plurality of other modules, a third module moving unit moving modules having macros to areas near a side of the chip, a macro layout unit allocating macros to corresponding areas within each module, and a macro moving unit moving macros within each module to remove macro overlap.

BRIEF DESCRIPTION OF THE DRAWINGS

These and other objects and advantages of the present invention will become apparent and more readily appreciated from the following description of the preferred embodiments, taken in conjunction with the accompanying drawings of which:

FIGS. 15A, 15B and 15C are respective illustrations of module rotation on a semiconductor chip.

FIGS. 22A, 22B and 22C respectively illustrate macro movement ④)-1 with respect to a semiconductor chip.

FIGS. 24A, 24B, 24C and 24D are respective schematic illustrations of macro movement ④)-3.

DETAILED DESCRIPTION OF THE PREFERRED EMBODIMENTS

Figure 1:
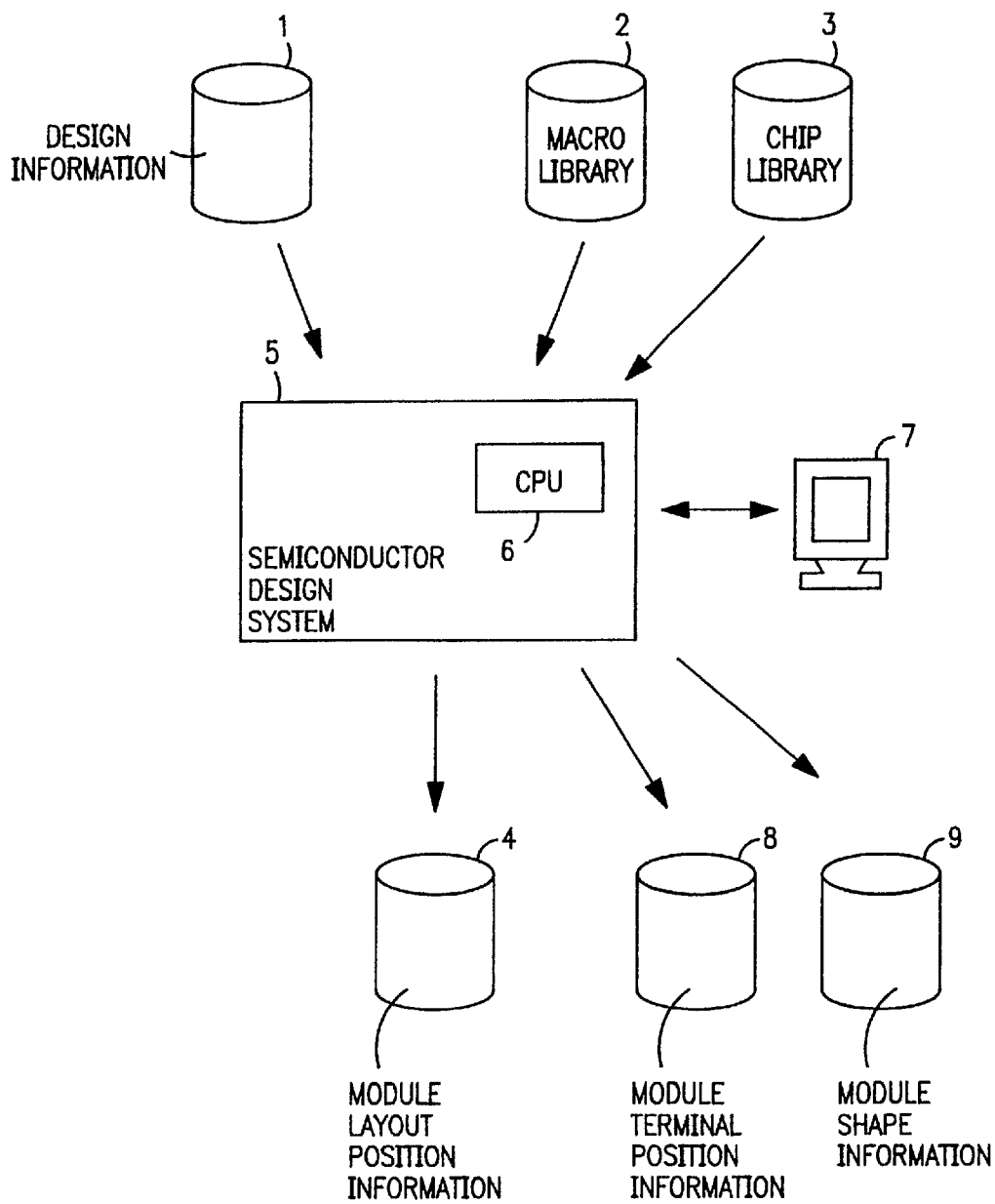
FIG. 1 illustrates a semiconductor design system according to an embodiment of the present invention.

Reference will now be made in detail to the preferred embodiments of the present invention, examples of which are illustrated in the accompanying drawings, wherein like reference numerals refer to like elements throughout.

FIG. 1 illustrates a principle of a semiconductor design system 5 according to the present invention. Design information 1, macro library 2 and chip library 3 are input to semiconductor design system 5. A series of processes are then performed on the basis of control by CPU 6, and module layout position information 4 is output therefrom. Moreover, in the semiconductor design system 5, communication with a designer is possible through the display 7. In addition, when a size of a module (i.e. number of areas) is defined in the design information 1, module terminal position information 8 and module shape information 9 are output.

In this system, programs are stored as required in a storage medium, such as semiconductor memory ("RAM," "ROM"), floppy disk ("FD"), hard disk ("HD"), optical disk ("CD," "DVD"), magneto-optical disk ("MO," "MD") and magnetic tape. This system may be used by installation on a workstation or personal computer, etc. through the storage medium.

Figure 2:
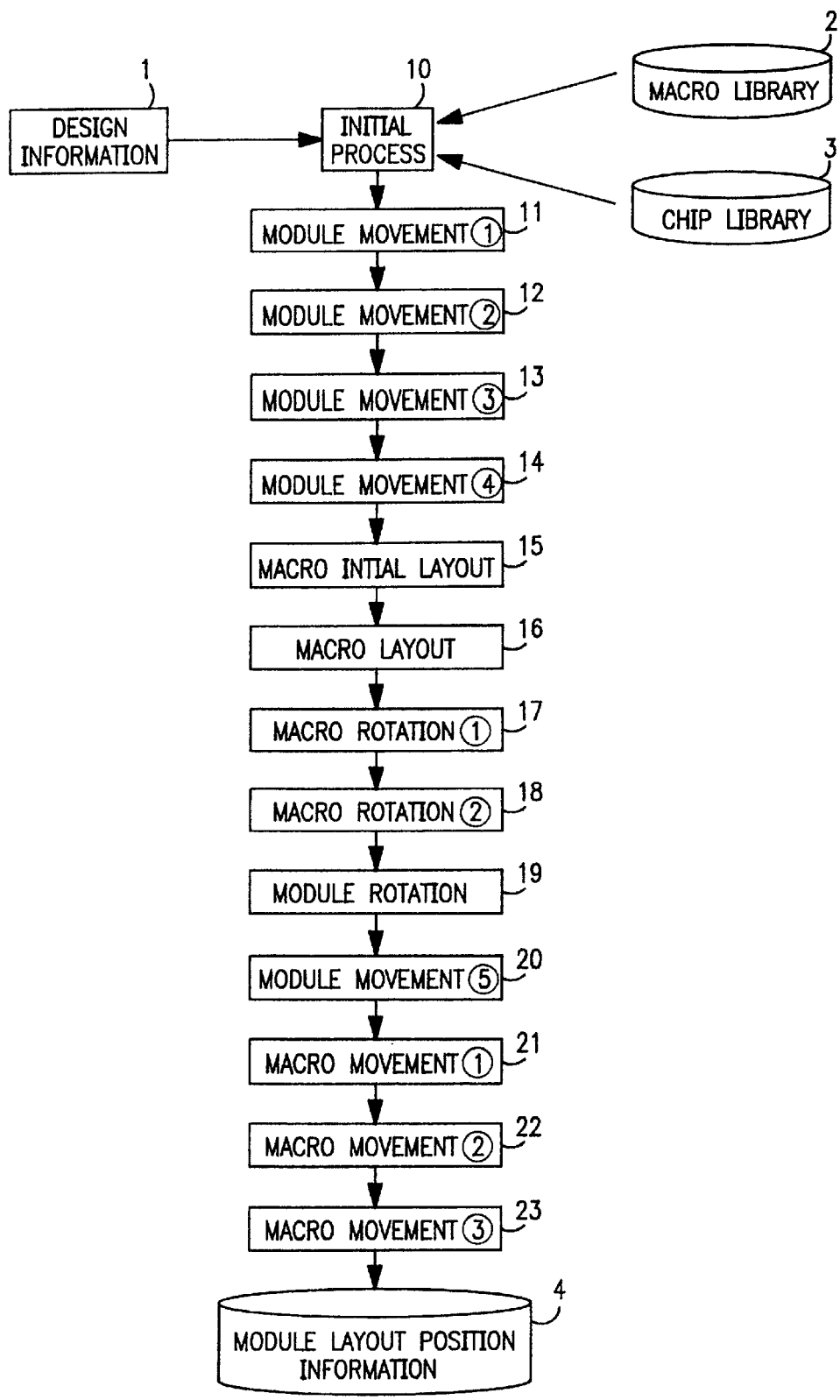
FIG. 2 is a flow diagram executing a semiconductor design method according to a first embodiment of the present invention.

FIG. 2 illustrates a first preferred embodiment of the present invention. FIG. 2 is a flow diagram of a semiconductor design method of a plurality of operations 10 to 24 for determining layout of modules in an upper layer stage of an LSI design, and for determining layout of macros in corresponding modules.

The design information 1 is the information obtained from the design specifications of a semiconductor chip and includes at least the following four pieces of information:

(1) module name,
(2) number of signal lines between the input/output pad and modules and signal direction, (3) number of signal lines among modules and signal direction, and (4) kinds and number of macros.

Although a size of a module (i.e. number of areas) is not always required, when the size of a module is defined in the design information, layout position of modules can be determined considering the module size, and highly accurate module layout position information can be obtained.

The macro library 2 is a library registering information about a macro and includes at least the following three pieces of information:

(1) macro size, (2) terminal position of the macro, and (3) macro type.

Although the macro name is not always required, the macro name can include common information of signal terminals. When the macro name is also registered to the macro library, the macro name is effective to easily extract common information of signal terminals.

The chip library 3 is a library registering information about the chip and includes at least the following three pieces of information:

(1) semiconductor chip size, (2) pad position, and (3) number of pads. The semiconductor design system 5 of the present invention requires as input information, at least, design information 1, macro library 2 and chip library 3.

Initial Process, Operation 10

Figure 3:
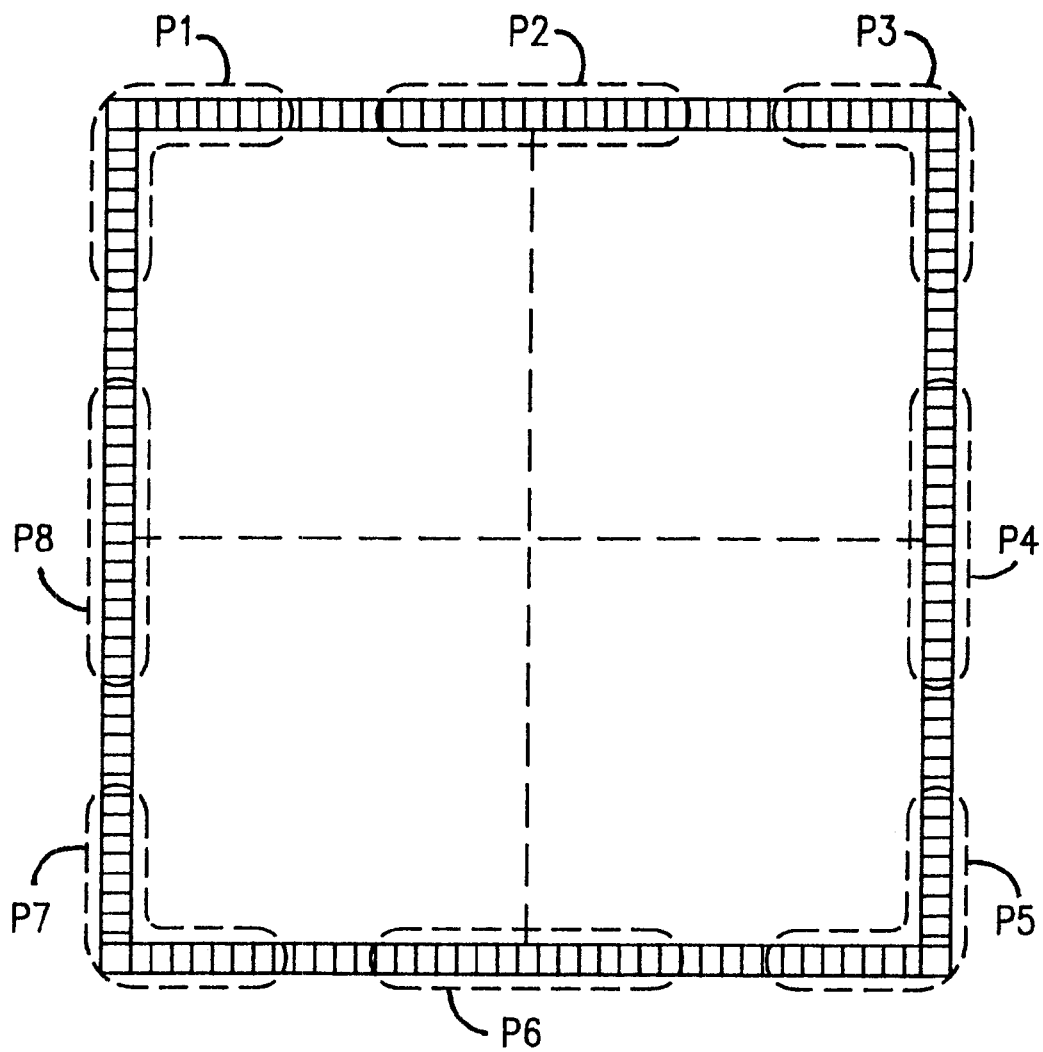
FIG. 3 is an illustration of an initial process of input/output pad division on a semiconductor chip.

FIG. 3 illustrates a practical example of division of the input/output pads on a semiconductor chip. FIG. 3 illustrates the initial process, operation 10 of FIG. 2, which executes division of the input/output pads and the initial layout of the module. The input/output pads, arranged in the periphery of the chip, are divided into a plurality of pad allocation areas P1 to P8. When a connecting relationship of a module and input/output pads is expressed by identifying many input/output pads, the connecting relationship becomes complicated. Therefore, the connecting relationship between the module and the input/output pads is replaced with a connecting relationship between the module and corresponding pad allocation areas P1 to P8 to simplify the process.

In FIG. 3, the input/output pads are divided into eight pad allocation areas P1 to P8. The pads may be divided into any desired number of areas, but when the pads are divided into a larger number of areas, the connecting relationship between a module and the input/output pads can be expressed more accurately.

Figure 4:
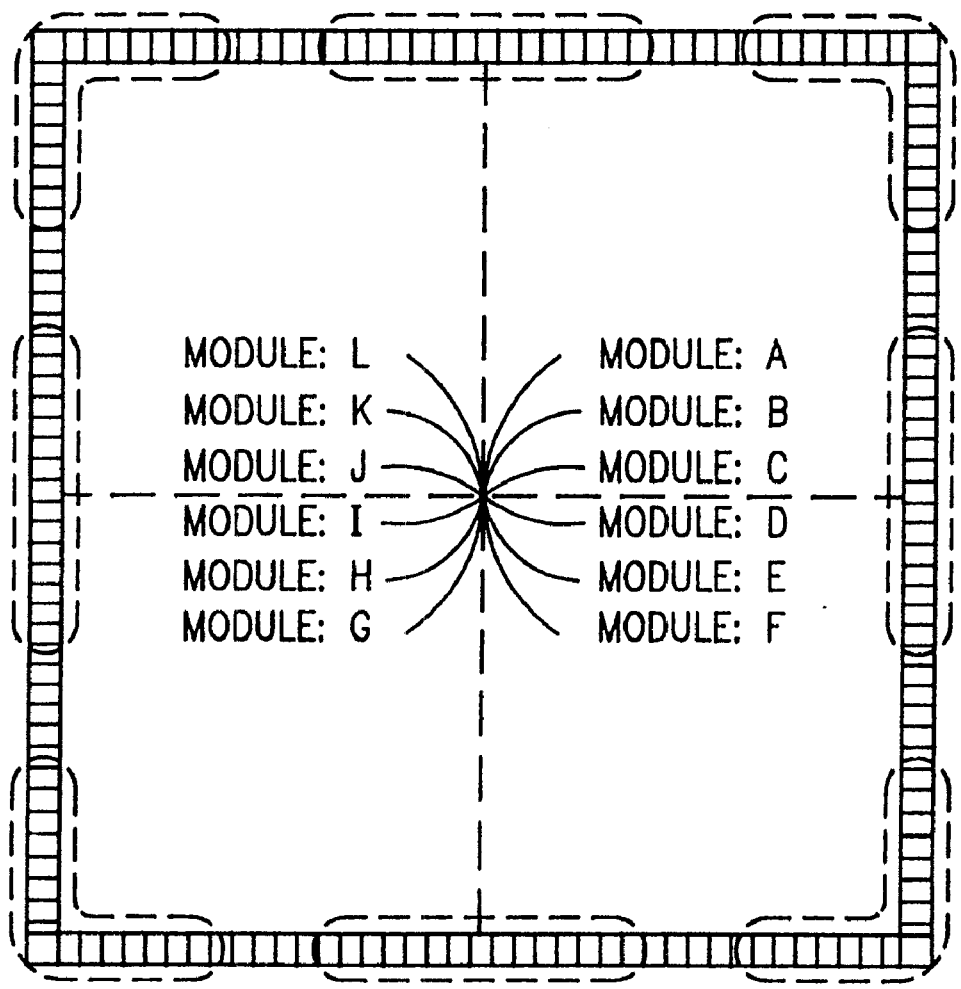
FIG. 4 is an illustration of an initial process of initial layout of modules on a semiconductor chip.

FIG. 4 illustrates a practical example of an initial layout of modules on a semiconductor chip. In the initial layout, the modules included in the chip are arranged in predetermined positions. In this first embodiment, a size of a module is not considered and the module is expressed by module coordinates indicating the position of the module. For example, the coordinates of a module may be expressed by a corresponding center point of the module.

In FIG. 4, a module is initially arranged at the center of the chip, but the layout position is not limited to the center of the chip, and the module can be arranged anywhere in a specified area. In the initial layout of the module, the position where modules are initially arranged is called the module initial layout position.

Module Movement ①, Operation 11

Figure 5:
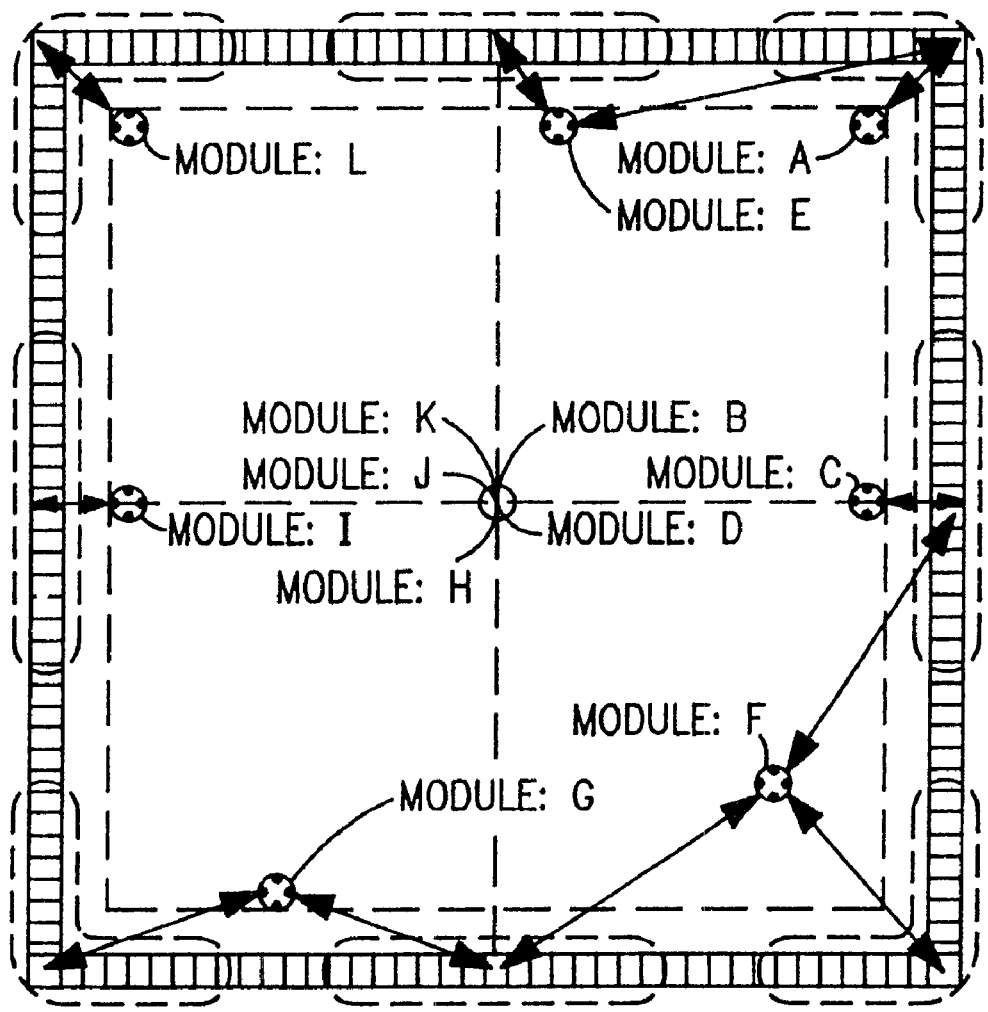
FIG. 5 is an illustration of module movement ①) on a semiconductor chip.
Figure 6:
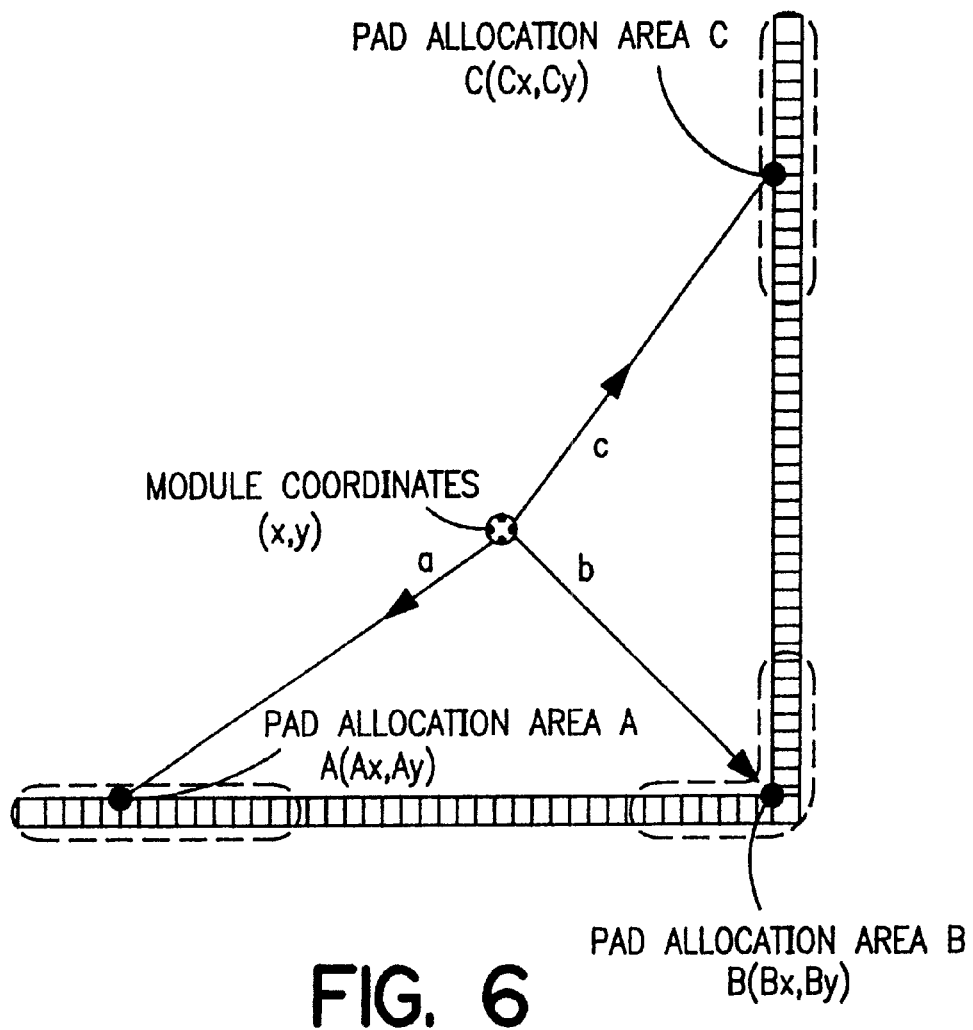
FIG. 6 is an illustration of module movement ①) on a semiconductor chip.

FIG. 5 illustrates a practical example of module movement ①, operation 11 of FIG. 2. FIG. 6 illustrates a practical example of determining a layout destination of a module, module movement ①, operation 11 of FIG. 2. In module movement ①, a module in a connecting relationship with a pad allocation area of the input/output pad is moved to an area near the pad allocation area.

Vectors between module coordinates of a module and the corresponding pad allocation area in the connecting relationship to the module are all collected. The size of each vector is expressed by the number of signal lines between the module and the corresponding pad allocation area. In FIG. 6, desired modules are in a connecting relationship with three pad allocation areas, namely pad allocation areas A, B, and C.

The module coordinates (x, y) as the module layout destination, can be obtained by solving equation (1) below for the following defined terms:

module coordinates: (x, y);

pad allocation area A: (Ax, Ay);

pad allocation area B: (Bx, By);

pad allocation area C: (Cx, Cy);

vector to pad allocation area A from module: a;

vector to pad allocation area B from module: b;

vector to pad allocation area C from module: c;

number of signal lines between the module and pad allocation area A: |a|;

number of signal lines between the module and pad allocation area B: |b|; and number of signal lines between the module and pad allocation area C: |c|.

Equation (1) for module layout destination:

$$a+b+c=|a|*($$
$$A_{x-x}, A_{y-y})/((A_{x-x})**2+($$
$$A_{y-y})++2)**(½)$$
$$+|b|*(B_{x-x}, B_{y-y})/(($$
$$B_{x-x})2+(B_{y-y})++2)(½)$$
$$+|c|*(C_{x-x}, C_{y-y})/((C_{x-x})**$$
$$2+(C_{y-y})++2)++(½)$$
$$=0$$

In module movement ①, the modules are arranged at the module coordinates obtained from Equation (1).

Module Movement ②, Operation 12

Figure 7:
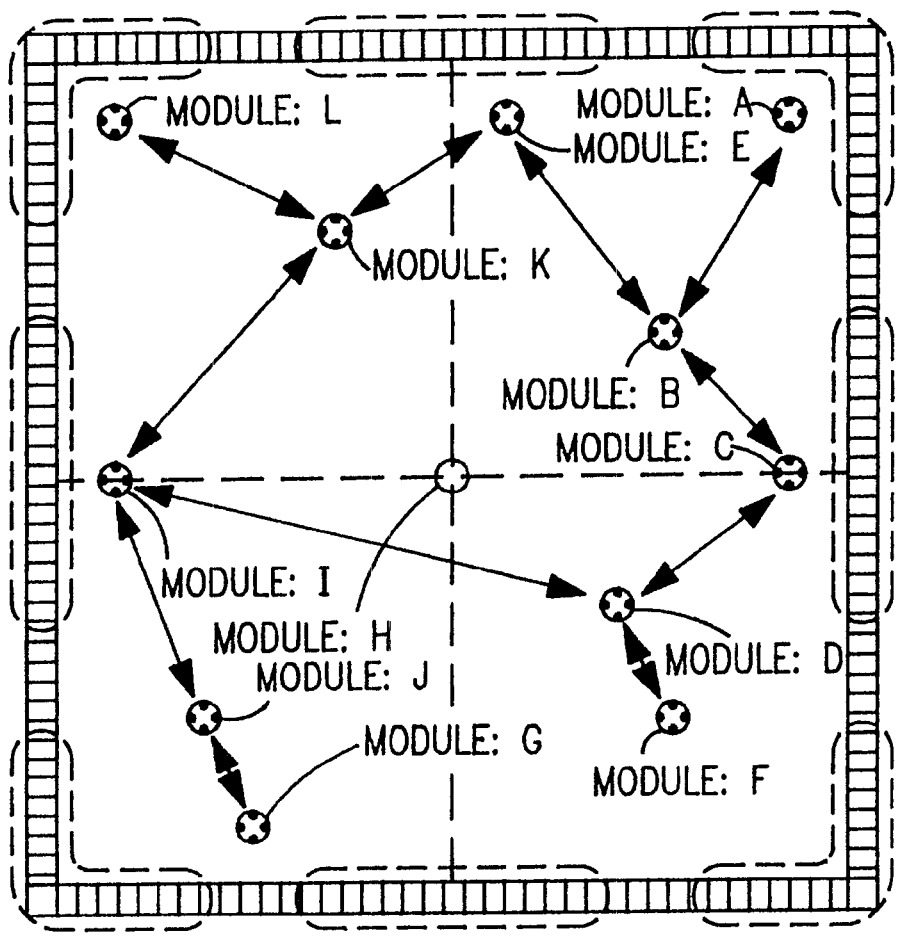
FIG. 7 is an illustration of module movement ②) on a semiconductor chip.

FIG. 7 illustrates a practical example of module movement ②, operation 12 of FIG. 2. In module movement ②, modules that have not yet been moved from the module initial layout position are moved. In the movement of a module by module movement ②, Equation (1) is applied to the modules that are in a connecting relationship with the modules moved by the process of module movement ① and that have not yet been moved from the module initial layout positions. By solving Equation (1), the module coordinates for newly arranging the modules not yet moved from module initial layout positions can be obtained, and therefore modules are arranged to such module coordinates.

In this case, the object modules for the connecting relationship are defined for only the modules that have been moved by the processes of the module movement processes ① and ②, but not for the modules that have not yet been moved from the module initial layout position.

The process of module movement ②, operation 12 of FIG. 2, is repeated until all the modules arranged in the module initial layout position have been moved.

Module Movement ③, Operation 13

Figure 8:
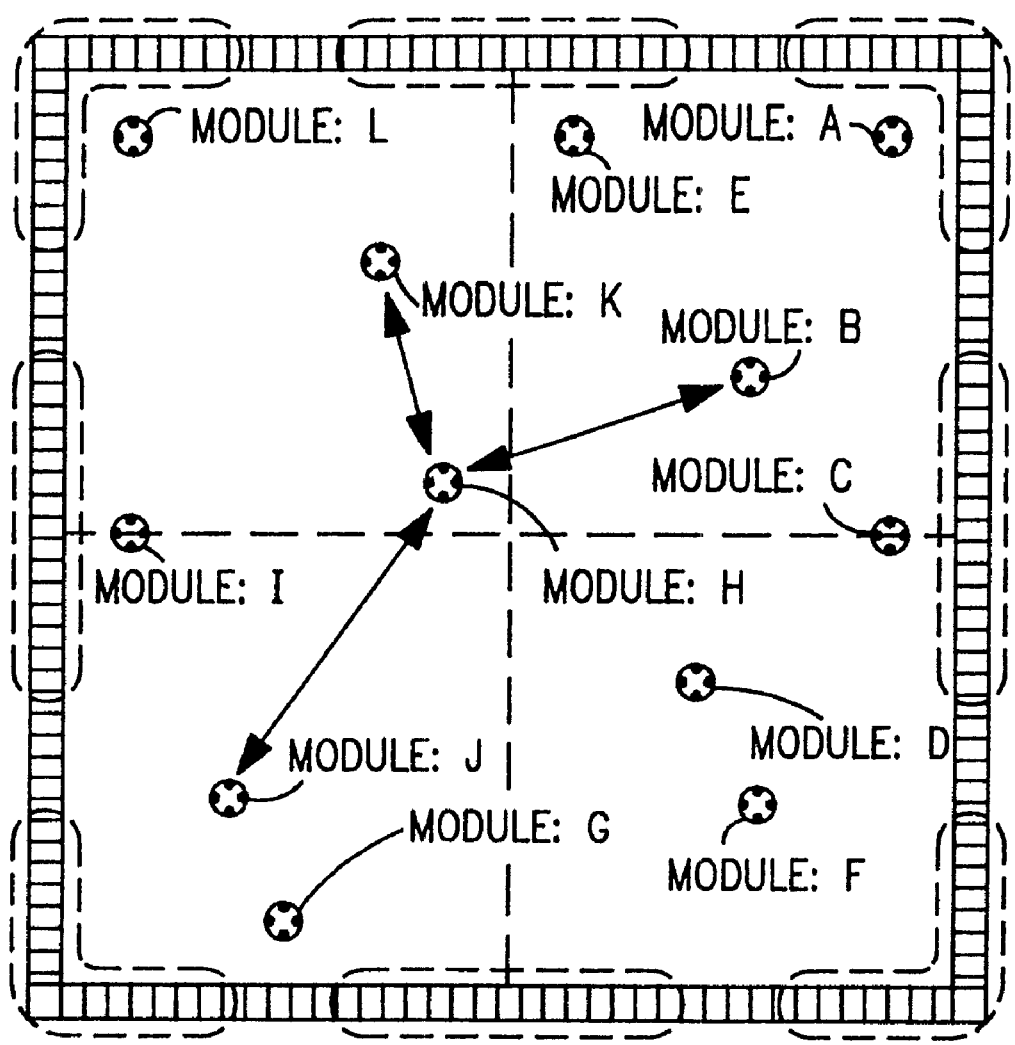
FIG. 8 is an illustration of module movement ③) on a semiconductor chip.

FIG. 8 illustrates a practical example of module movement ③, operation 13 of FIG. 2. In module movement ③, desired modules are moved. Previously, in module movement ①, only the connecting relationship with the input/output pad is considered, while in module movement ②, only the connecting relationship with modules moved by module movement ① and the preceding modules moved by module movement ② are considered, respectively. The connecting relationship with the other modules is not considered. Therefore, in module movement ① attention is given to desired modules in module movement ③, and modules are moved considering all connecting relationships of the modules.

The processing sequence of module movement ③ is explained below.

(a) In FIG. 8, attention is given to a desired module H. First, an average position vector of module H is obtained. As illustrated, the module H has a connecting relationship with the modules B, J and K. The position vector between modules H and B, the position vector between modules H and J, and the position vector between modules H and K are respectively obtained and an average value is obtained from these position vectors. This average value is the average position vector. Here, a size of each position vector is expressed by the number of signal lines between the modules.

(b) Next, the average position vector of all modules is obtained.

(c) For all modules for which the average position vector is obtained, a difference between the average position vector and the current position vector of the module is compared with a predetermined value.

(d) Where the modules for which the difference between the average position vector and the current position vector is larger than the predetermined value, one module in the modules having the average position vector larger than the predetermined value is moved to the average position vector. As the method for selecting one module, the module having the smallest or largest average position vector is selected.

(e) The processes from a to d are repeated until the difference between the average position vector of all modules and the current position vector of each module becomes smaller than a predetermined value.

With the process of module movement ③, operation 13 of FIG. 2, the modules having many signal lines are arranged closely with each other, while the modules having a small number of signal lines are arranged in isolation.

Module Movement ④, Operation 14

Figure 9:
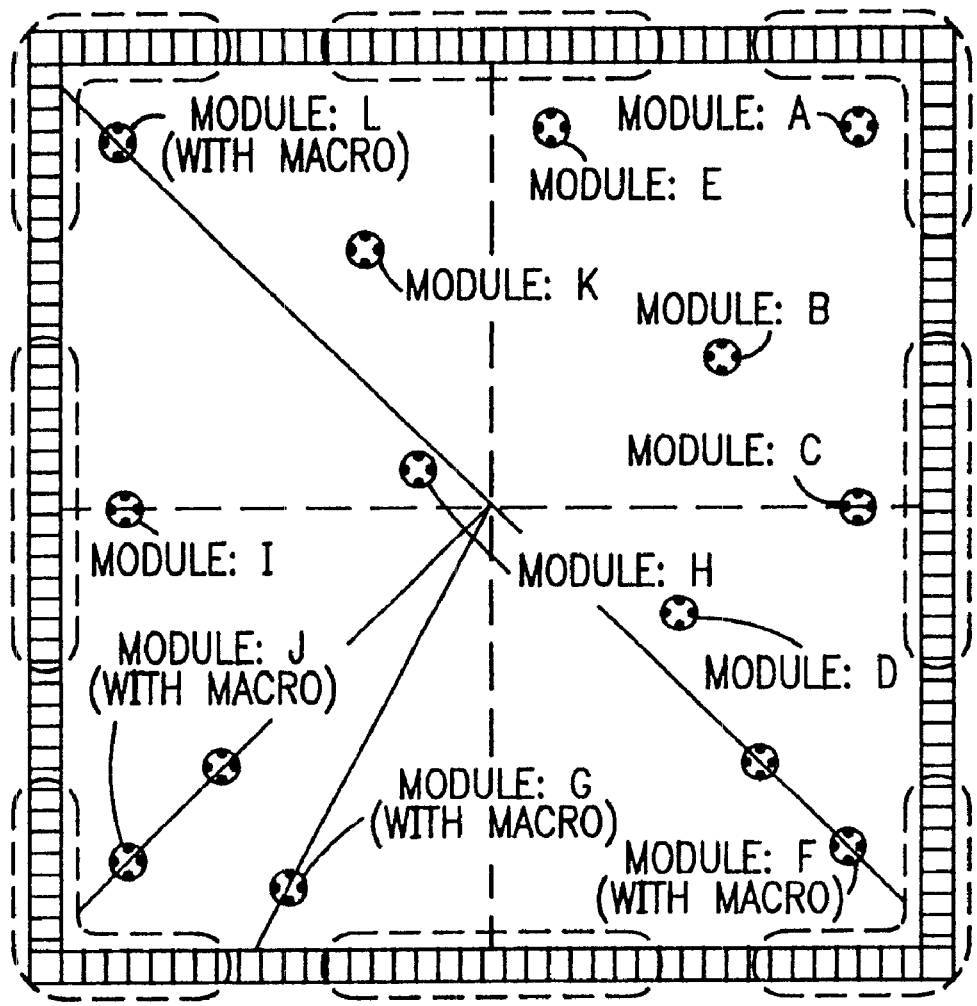
FIG. 9 is an illustration of module movement ④) on a semiconductor chip.

FIG. 9 illustrates a practical example of module movement ④, operation 14 of FIG. 2. In module movement ④₁, modules comprising macros are moved to areas near the chip sides. More specifically, in FIG. 9, the modules comprising macros are moved in a direction connecting the center of the chip and the module coordinates of these modules, and are arranged in the areas near the chip sides.

Macro Initial Layout, Operation 15

Figure 10:
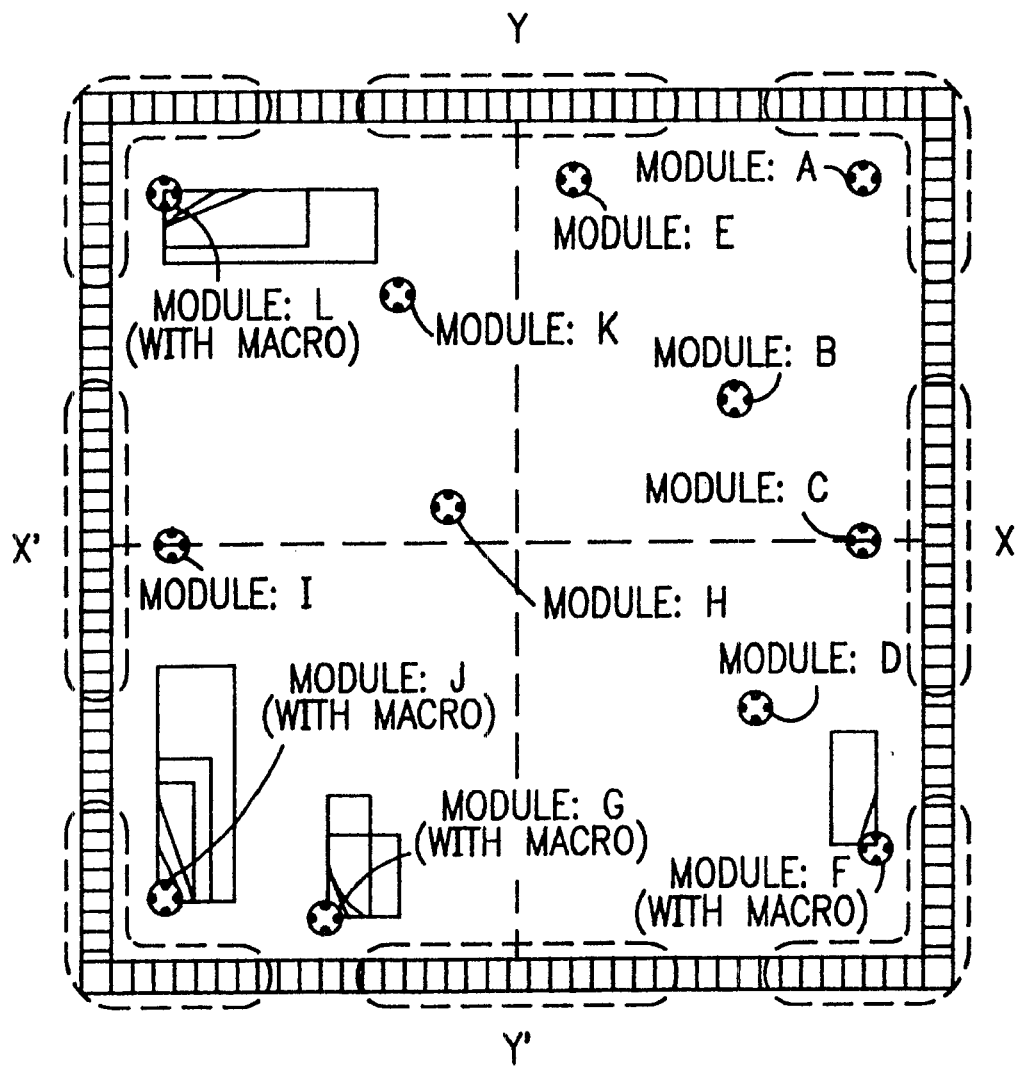
FIG. 10 is an illustration of a macro initial layout on a semiconductor chip.

FIG. 10 illustrates a practical example of a macro initial layout, operation 15 of FIG. 2. The initial layout of a macro is conducted in the macro initial layout. For each module having macros, all macros included in a module are arranged at the coordinates of a module. As illustrated in FIG. 10, macros are overlapped on module coordinates.

Macro Layout, Operation 16

Figure 11:
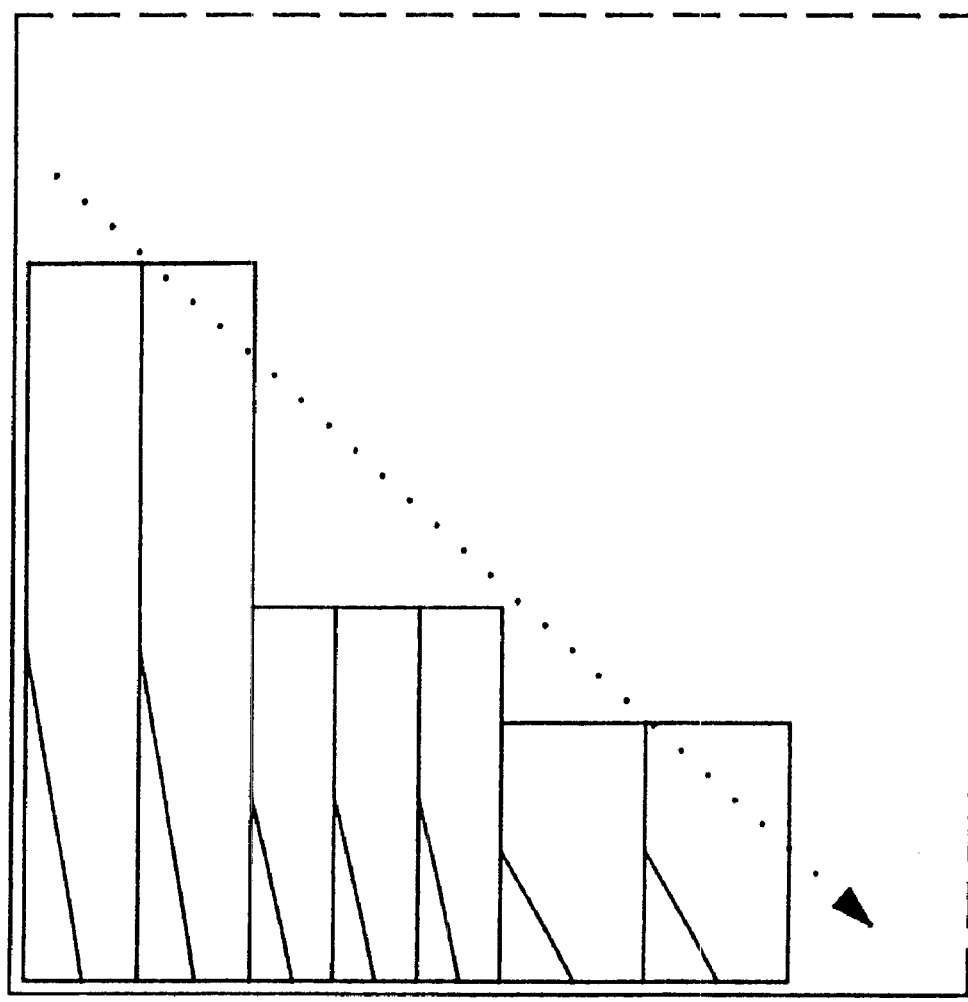
FIG. 11 is a schematic illustration of macro layout.
Figure 12:
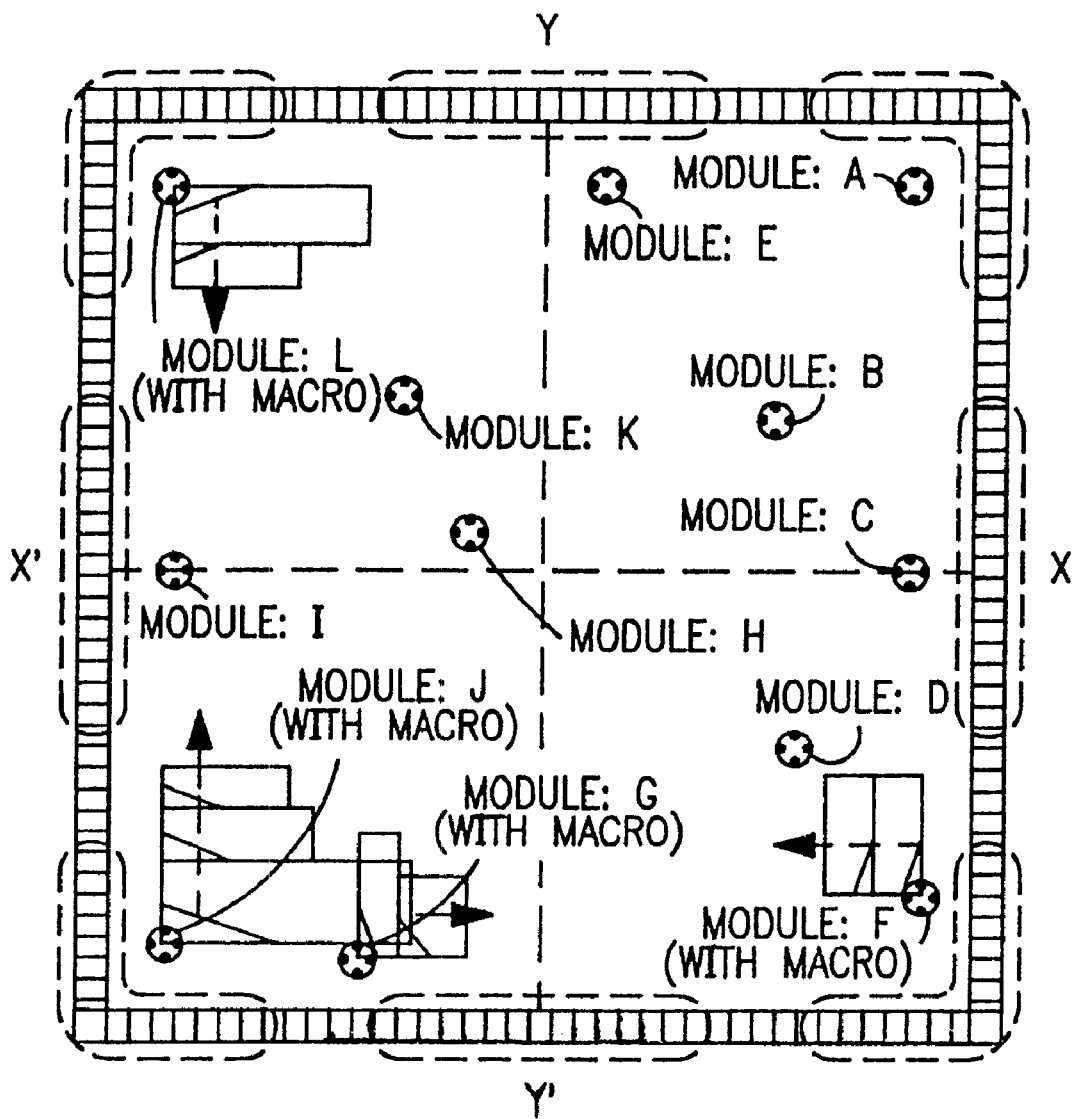
FIG. 12 is an illustration of macro layout.

FIG. 11 and FIG. 12 illustrate practical examples of a macro layout, operation 16 of FIG. 2. In the macro layout, macros located at module coordinates by the macro initial layout, operation 15 of FIG. 2, are arranged. In FIG. 11, macros in the module are arranged in a sequence according to length of the macro, from largest to shortest, with the largest macro being positioned closest to the chip side.

FIG. 12 illustrates a method for determining along which side of two adjacent sides the long side of a macro should be laid. First, it is determined whether the module coordinates of the module are closer to the line X–X' dividing the chip into two sections in the lateral direction, or the line Y–Y' dividing the chip into two sections in the vertical direction.

When the module coordinates of a module are nearer to the line X–X' than Y–Y', the longer side of the macro is laid with respect to the lateral side (i.e. right or left side) of the chip. When the module coordinates of a module are nearer to the line Y–Y' than X–X', the longer side of the macro is laid with respect to the vertical side (i.e. top or bottom) of the chip. With the method explained above, because the module coordinates of module J are nearer to the line Y–Y' than the line X–X' in FIG. 12, the longer side of the macro is laid to correspond with the vertical side (i.e. bottom side) of the chip. Moreover, because the module coordinates of module G are closer to the line X–X' than the line Y–Y', the longer side of the macro is laid to correspond with the vertical side (i.e. left side) of the chip.

Macro Rotation ①, Operation 17

Figure 13A:
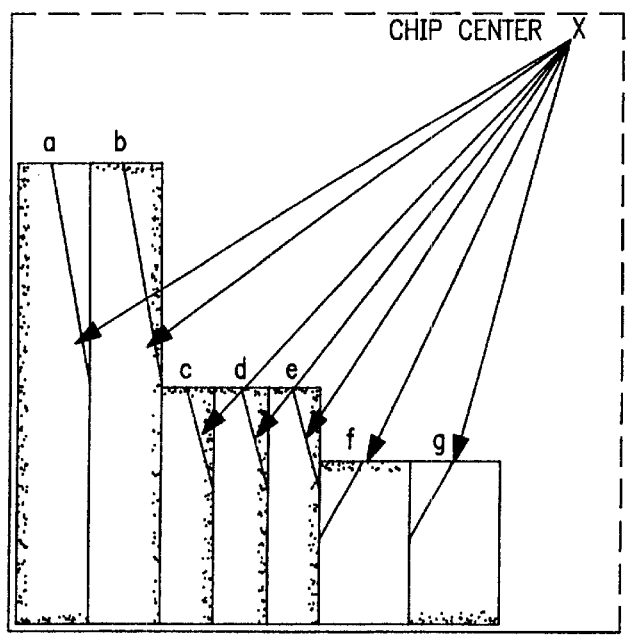
FIGS. 13A and 13B are respective illustrations of macro rotation ①) and macro rotation ①).
Figure 13B:
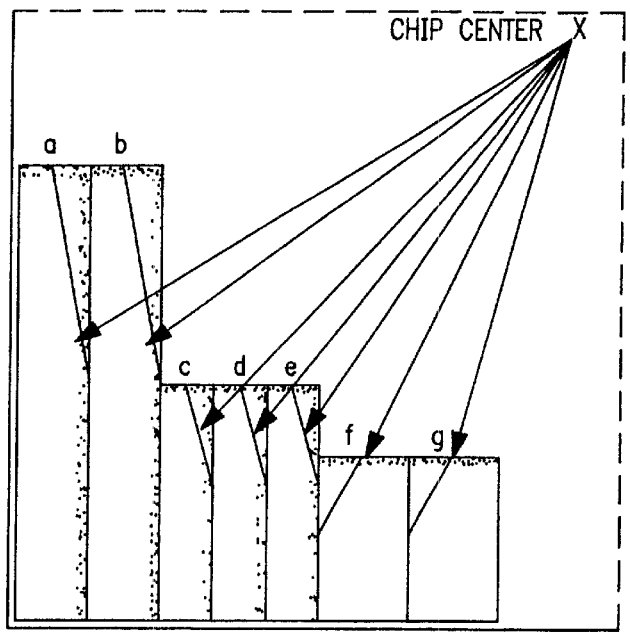

FIGS. 13A and 13B respectively illustrate a practical example of macro rotation ①, operation 17 of FIG. 2. In macro rotation ①, the macros previously arranged by the macro layout are rotated based on the signal terminal positions of each macro. In FIG. 13A and FIG. 13B, the dotted areas indicate where signal terminals of a macro actually exists.

The position vectors to the center of the chip from each signal terminal of the macros are obtained, and an average value of these vectors is determined. This average position vector can be considered as the gravity of the signal terminals of the macros for the center of the chip. A macro is rotated under the condition that the layout of laying the longer side of a macro along the predetermined chip side is maintained, so that this gravity nears the chip center.

FIG. 13A illustrates a macro layout before rotation and FIG. 13B illustrates a macro layout after rotation. In FIG. 13A, because gravity (i.e. average position vector) of the signal terminal of macro "a" for the center of the chip and the gravity (i.e. average position vector) of the signal terminal of macro "g" for the center of the chip are far from the chip center, the macros "a" and "g" are rotated as illustrated in FIG. 13B.

Macro Rotation ②, Operation 18

Figure 14A:
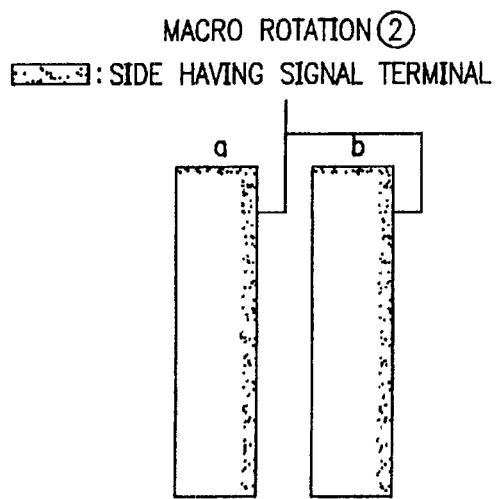
FIGS. 14A, 14B and 14C are respective illustrations of macro rotation ②) on a semiconductor chip.
Figure 14B:
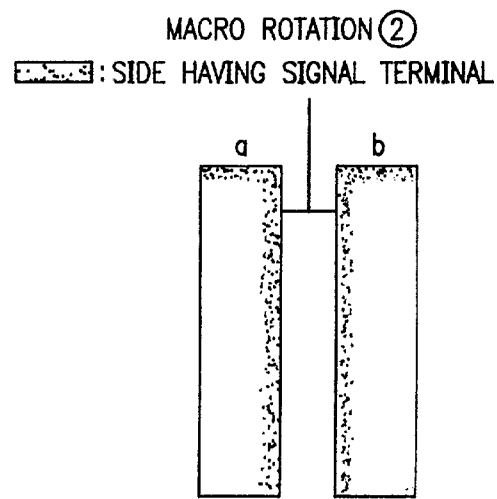
Figure 14C:
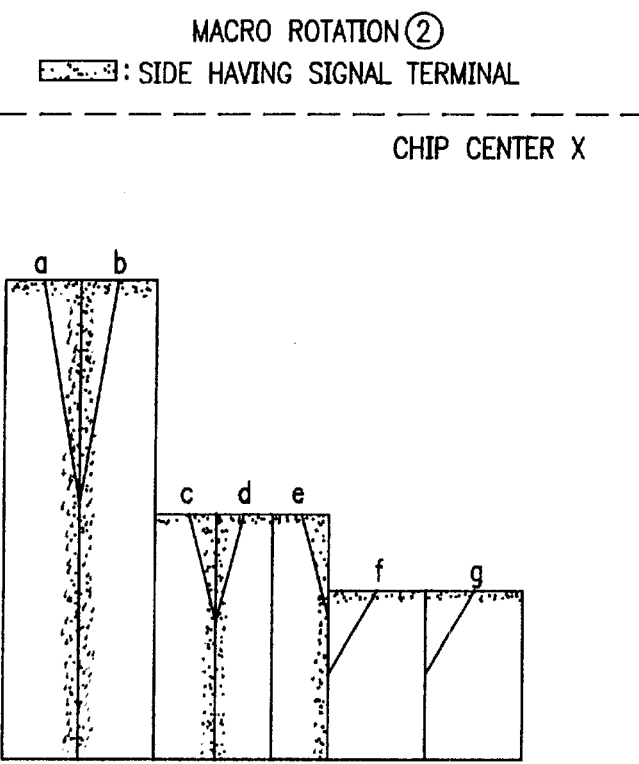

FIGS. 14A, 14B, and 14C illustrate a practical example of macro rotation ②, operation 18 of FIG. 2. In macro rotation ②, a macro is rotated when macros using a common signal are located adjacently. In FIG. 14A, FIG. 14B and FIG. 14C, the dotted areas indicate macro signal terminals. When the macros of the same macro type are arranged adjacently, the signal terminals may frequently be commonly used.

FIG. 14A illustrates that macros "a" and "b" are of the same macro type, having completed the process of macro rotation ①, operation 17 of FIG. 2. The macros "a" and "b" have a higher probability for common use of a signal because these macros have the same macro type, but because the side having the signal terminal of macro "a" and the side having the signal terminal of macro "b" are directed in the same direction, it is required to provide an alternative route for the signal line to supply the signal.

When the signal can be used in common, wiring efficiency is enhanced. Therefore, as illustrated in FIG. 14B, when a signal can be used in common by providing face-to-face the sides having the signal terminals of the macros "a" and "b" through rotation of macro "b," wiring efficiency of common signal wiring can be enhanced. In FIG. 14C, the overall process of macro rotation ②, operation 18 of FIG. 2, is performed for the macro "b" shown in FIG. 14B. As set forth above, macro "b" of FIG. 14B has completed the process of macro rotation ①, operation 17 of FIG. 2. Because the macros "a" and "b" and the macros "c" and "d," respectively, have the same macro type, the macros "b" and "d" are rotated.

Information about the macro type can be obtained from macro library 2. When a macro name, indicating the common information of the signal terminal, is registered in the macro library 2, it is very convenient to extract the signal terminals of macros for common use from the macro name.

Module Rotation, Operation 19

FIGS. 15A and 15B illustrate a practical example of module rotation. As illustrated, the dotted areas indicate where a signal terminal of a macro exists. In the module rotation, operation 19 of FIG. 2, a module including a macro is rotated based on the position of the signal terminal of the macro, a wiring interval of each wiring layer, and a wiring direction.

For example, it is assumed that a chip is formed of four wiring layers. In an ordinary condition, each wiring layer has a limitation in the wiring interval and wiring direction. As an example, such limitations are explained below. Here, the "wiring interval" is the number of signal lines which may be wired in the unit area.

First Layer:
  Wiring direction: Vertical; Wiring interval: 3 lines.
Second Layer:
  Wiring direction: Lateral; Wiring interval: 3 lines.
Third Layer:
  Wiring direction: Vertical; Wiring interval: 3 lines.
Fourth Layer:
  Wiring direction: Lateral; Wiring interval: 1 line.

In the vertical direction, a total of six lines can be wired in the unit area, owing to three lines of the first layer and three lines of the third layer. In the lateral direction, a total of four lines can be wired in the unit area, owing to three lines of the second layer and one line of the fourth layer. Therefore, many lines may be wired in the vertical direction but a limitation on the number of wires is generated in the lateral direction to a larger extent than in the vertical direction.

FIG. 15A and FIG. 15B illustrate macro layout in a module. The signal terminal positions of macros "a," "b" and "c" are indicated by oblique lines. In FIG. 15A, the wiring in the lateral direction must be provided to supply the signal to the signal terminal of each macro from the signal wiring extending in the vertical direction. Meanwhile, in FIG. 15B, the signal can be supplied directly to the signal terminal of each macro from the signal wiring extending in the vertical direction. Therefore in FIG. 15B, wiring in the lateral direction is not required.

In a chip having a limitation for the number of wires in the lateral direction, it is a matter of course that the module having the macro layout illustrated in FIG. 15B is preferable. For example, in a chip having a limitation on the number of wires in the lateral direction, when the macro layout of the module is changed to that of FIG. 15A as a result of a process such as macro layout or macro rotation, the module (macro layout) is rotated to get the layout of FIG. 15B. As explained above, the operation of module rotation 19 of FIG. 2 is performed to conform to the limitation on the number of wires and improve the wiring efficiency.

FIG. 15C illustrates a chip having completed the process of module rotation 19 of FIG. 2, which allows more wiring in the vertical direction (for a chip having a limitation on the number of wires in the lateral direction).

Module Movement ⑤, Operation 20

Figure 16:
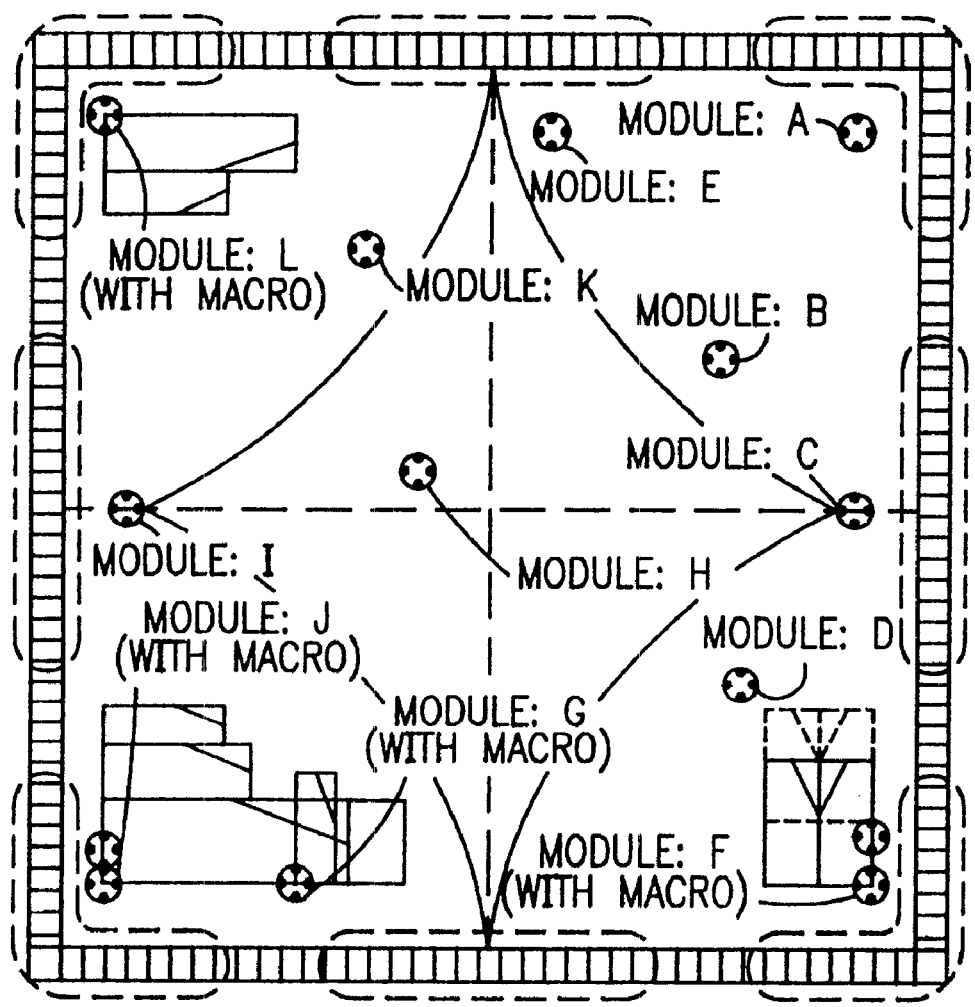
FIG. 16 is an illustration of module movement ⑤) on a semiconductor chip.

FIG. 16 illustrates a practical example of module movement ⑤, operation 20 of FIG. 2. In module movement ⑤, a predetermined module is arranged near the corner of the chip. A module having a large macro is then arranged at the corner of the chip.

Selection of the module to be arranged at the corner of the chip is performed, for example, as illustrated in FIG. 16. A quarter circle is drawn around the corner of the chip, defined as the center of the circle, while the radius is gradually increased toward the center of the chip to find the module coordinates of the module. The module having the largest macro is arranged at the corner of the chip by comparing sizes of the macros of this module. In this case, the size of the macro is determined with reference to the longer side of the macro.

Macro Movement ①, Operation 21

Figure 17:
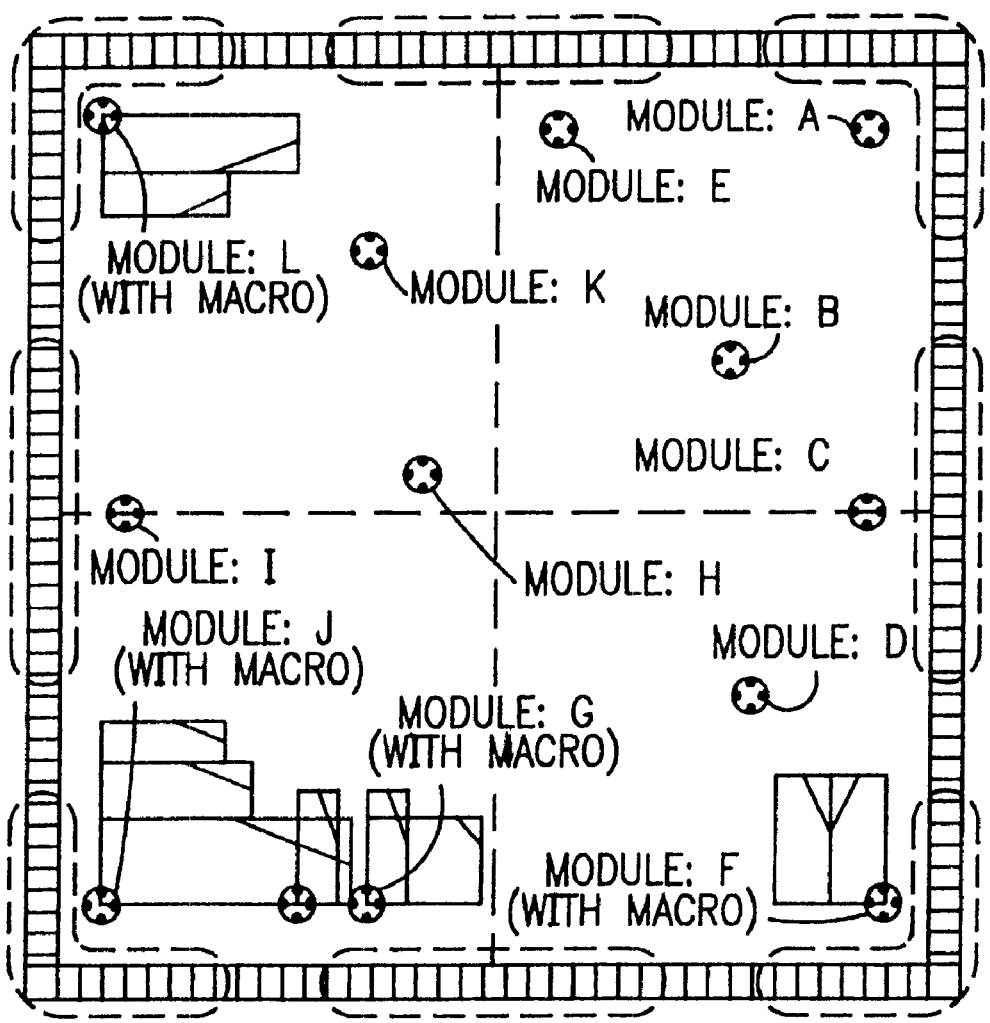
FIG. 17 is an illustration of macro movement ①) on a semiconductor chip.

FIG. 17 illustrates a practical example of macro movement ①, operation 21 of FIG. 2. In the macro movement ①, a macro is moved to eliminate overlap of macros. In FIG. 17, because the macro group of module J and the macro group of module G overlap, module G is moved in parallel to the internal side of the chip to remove the overlapped area.

The macro is sequentially moved toward the center of the chip from the macro isolated farthest from the center of the chip toward the macro nearer to the center of the chip under the condition that the module arranged nearest to the corner of the chip is fixed by module movement ⑤.

Macro Movement ②, Operation 22

Figure 18:
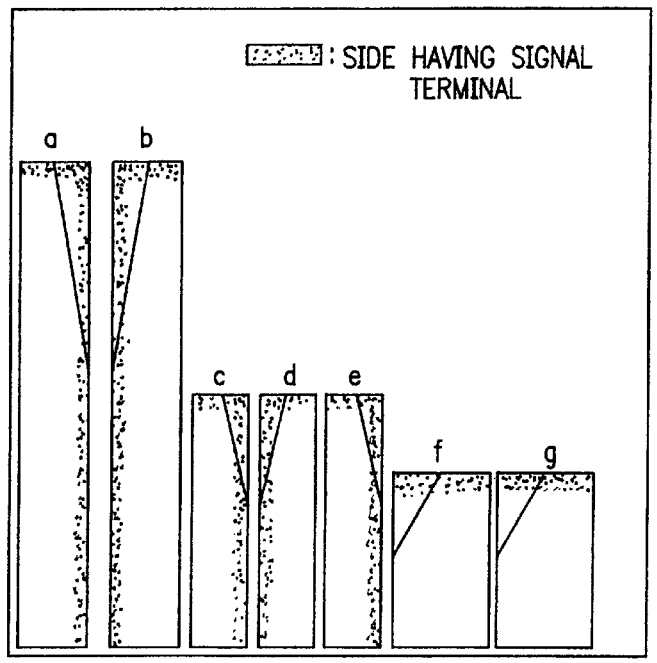
FIG. 18 is an illustration of macro movement ②) on a semiconductor chip.

FIG. 18 illustrates a practical example of macro movement ②, operation 22 of FIG. 2. In macro movement ②, a macro is moved based on the rule for a minimum interval among macros. When the rule for the minimum interval among macros is determined, an interval of macros is widened more than the minimum interval specified in the rule.

A macro is sequentially moved toward the center of the chip from the macro isolated farthest from the center of the chip to the macro nearest to the center of chip under the condition that the macro nearer to the side of the chip (the macro isolated farthest from the center of the chip) is fixed.

Macro Movement ③, Operation 23

Figure 19:
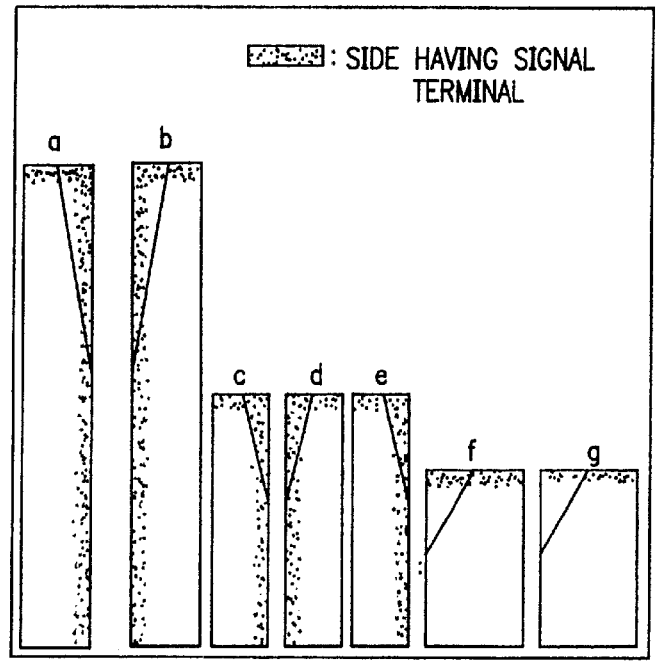
FIG. 19 is an illustration of macro movement ③) on a semiconductor chip.

FIG. 19 illustrates a practical example of macro movement ③, operation 23 of FIG. 2. In macro movement ③, a macro is moved based on the number of signal terminals of the macro. In FIG. 19, the dotted area indicates where a signal terminal of a macro exists.

An interval among macros is adjusted, considering the number of signal terminals of the macro, the number of signal terminals of the macro beside the first macro facing the side having the signal terminal of the first macro, the number of wiring layers, the wiring interval of each wiring layer and the wiring direction of each wiring layer, etc.

A macro is sequentially moved in a direction toward the center of the chip, i.e. from a position farther from the center of the chip toward a macro nearer to the center of the chip, under a condition that the macro nearer to the side of the chip (the macro isolated farther from the center of the chip) is fixed.

An explanation will be made based on FIG. 19. Because the signal wire for supplying the signal to the signal terminal of macro "a" and the signal wire for supplying the signal to the signal terminal of macro "b" must be wired between the macros "a" and "b," if the signal wiring area cannot be attained in the minimum interval of the macros, an interval between macros "a" and "b" must be widened.

Because a signal terminal does not exist between macros "b" and "c," only the minimum interval among these macros needs to be maintained, and therefore the macro interval does not need to be adjusted between macro "b" and macro "c."

Among the macros "e" and "f," signal wiring is only required to supply the signal to the signal terminal of macro "e." If the signal wiring area cannot be attained in the minimum interval of macros, then the macro interval must be widened.

End of Process

The semiconductor design system of the present invention starts from the process of the module initial layout 10 and completes in the process of macro movement ③, operation 23 of FIG. 2, using at least design information 1, the macro library 2, and the chip library 3 as the input information. With this series of processes, the layout position information 4 of the module where the macros are adequately arranged in the periphery of the chip can be obtained.

Figure 20:
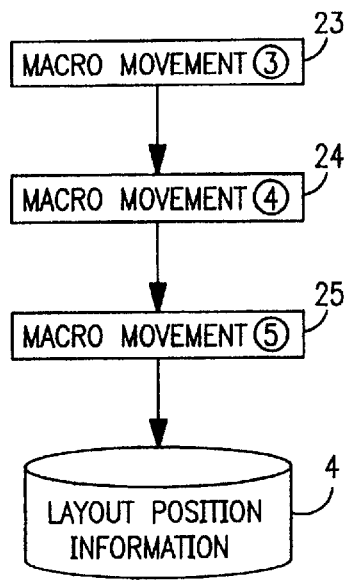
FIG. 20 is flow diagram of a semiconductor design method according to a second embodiment of the present invention.
Figure 21:
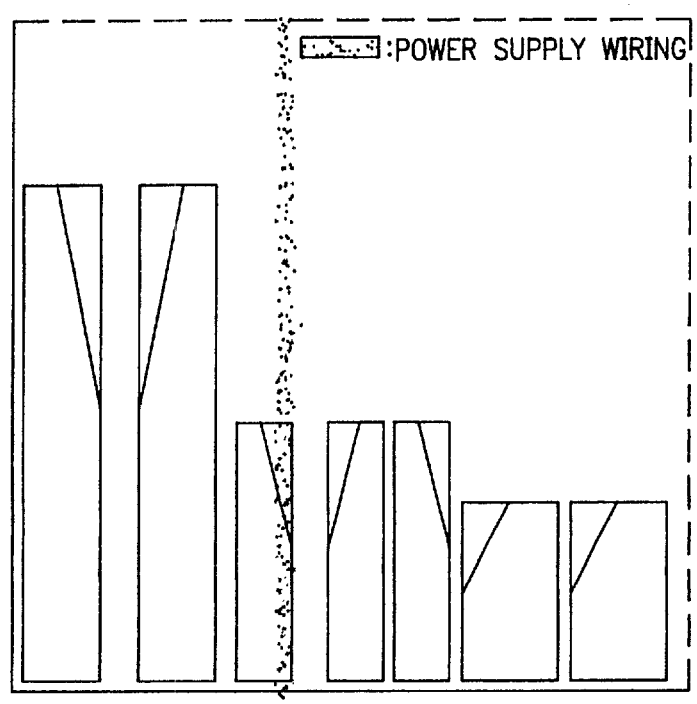
FIG. 21 is a schematic power supply wiring diagram according to the second embodiment of the present invention.

FIG. 20 and FIG. 21 illustrate a semiconductor design system according to a second embodiment of the present invention. In FIG. 21, the dotted area indicates power supply wiring. The second embodiment of the present invention particularly relates to a process to be conducted when the fixed power supply wiring and a macro cross with each other, as illustrated in FIG. 21. Moreover, the second embodiment of the present invention is also performed after an end of the processes indicated in the first embodiment.

Macro Movement ④, Operation 24

With reference to FIG. 20 and FIG. 21, movement of a macro upon overlap with a fixed power supply will be described. In macro movement ④, operation 24 of FIG. 20, a macro is moved when the fixed power supply wiring of the chip overlaps a macro. The following three situations arise when the fixed power supply wiring of the chip crosses a macro, providing different ways of macro movement:

(a) when the fixed power supply wiring exists on the macro area, (b) when the fixed power supply wiring exists on the side of the macro farther from the chip center, and (c) when the fixed power supply wiring exists on the side of the macro nearer to the chip center.

The way to Move a Macro in the Above Three Cases will now be Explained.

(a) The fixed power supply wiring exists on the macro area.

The layout relationship of the fixed power supply wiring and the macro in this case is particularly illustrated in FIG. 22A. In FIG. 22A, FIG. 22B and FIG. 22C, the dotted areas indicate fixed power supply wiring. For the layout relationship of FIG. 22A, the macro is moved a predetermined distance toward the center of the chip, as illustrated in FIG. 22B.

FIG. 22C illustrates a practical wiring relationship when the fixed power supply wiring and the macro are in the layout relationship illustrated in FIG. 22A. The fixed power supply wiring is connected in contact C1 and contact C2 with a power supply ring arranged in the periphery of the macro. Because the wiring layers for lateral wiring and vertical wiring are different due to the limitation on the wiring direction of the wiring layer, the lateral direction of the power supply ring is indicated by the area having closely-spaced hatch marks, while the vertical direction of the power supply ring is indicated by the area having larger-spaced hatch marks. When it is assumed that a predetermined current I flows into the fixed power supply wiring, this current I is branched into the current $I_1$ and the current $I_2$ at the power supply ring.

The fixed power supply wiring is then required to supply sufficient current into the chip, and therefore its wiring width is thick in comparison with the power supply ring for supplying a current to the macros. Accordingly, the power supply ring must have sufficient wiring width to supply the current $I_1$ and current $I_2$, of which the sum is equal to the current I. Therefore, this wiring width becomes thicker than that of the power supply ring in the case where the fixed power supply wiring does not pass on the macro area. Because it is required to acquire the area for wiring the power supply ring, which is thicker than that in the ordinary case, the macro must be moved as much as the increase in the thickness of the power supply ring. This movement is the predetermined value discussed above.

When the macro is moved so as to remove the overlapped area between the macro and the fixed power supply wiring, the wiring width of the power supply ring arranged in the periphery of the macro is not required to be thick. However, such large movement gives a large influence on the layout of the other modules, and therefore the movement is limited to the predetermined value in this second embodiment.

When many fixed power supply wires exist in the area of the macro isolated farther from the chip center, the macro may be moved so that the side of the macro farther from the chip center overlaps on the side of the fixed power supply wire isolated farther from the chip center.

(b) The fixed power supply wiring exists on the side of the macro isolated farther from the chip center.

Figures 23A, 23B:
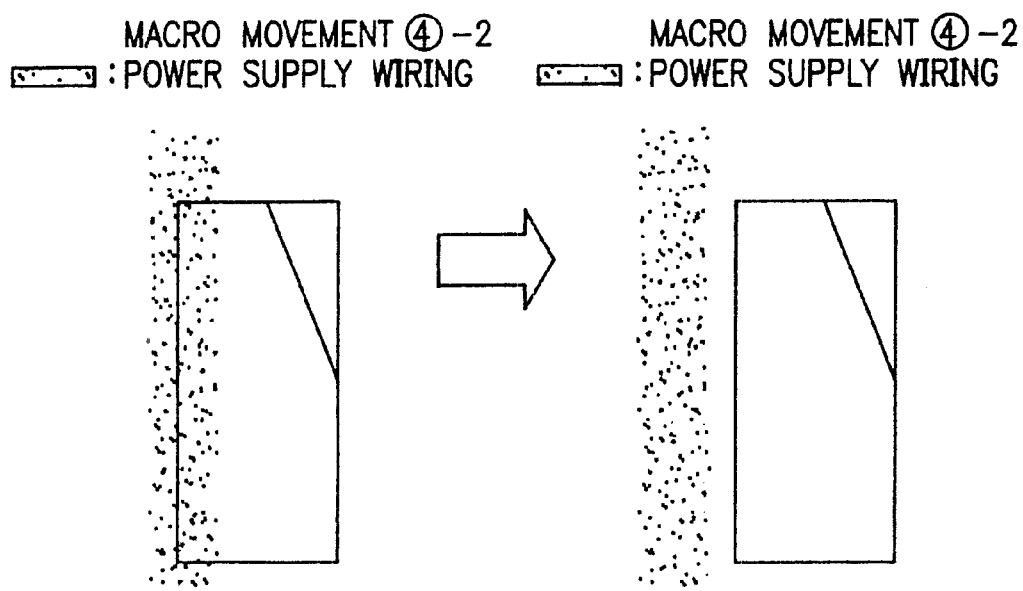
FIGS. 23A and 23B are respective schematic illustrations of movement ④)-2.

The layout relationship between the fixed power supply wiring and the macro in this case is illustrated in FIG. 23A. In FIG. 23A and FIG. 23B, the dotted areas indicate the fixed power supply wiring. In the layout relationship of FIG. 23A, the macro is moved toward the chip center so that the side of the macro isolated farther from the chip center does not overlap the fixed power supply wiring, as illustrated in FIG. 23B.

When the macro does not overlap the fixed power supply wiring, as explained in (a), the wiring width of the power supply ring arranged in the periphery of the macro does not need to be thick, and thus the wiring area can be reduced.

(c) The fixed power supply wiring exists on the side of the macro nearer the chip center.

The layout relationship between the fixed power supply wiring and the macro in this case is illustrated in FIG. 24A. In FIG. 24A, FIG. 24B, FIG. 24C and FIG. 24D, the dotted areas indicate respectively the fixed power supply wiring.

For the wiring relationship illustrated in FIG. 24A, the macro is moved toward the chip center so that the side of the macro nearer the chip center overlaps the side of the fixed power supply wiring nearer the chip center, as illustrated in FIG. 24B.

FIG. 24C illustrates a practical wiring relationship when the fixed power supply wiring and the macro are in the layout relationship illustrated in FIG. 24A. The fixed power supply wiring is connected to the power supply ring arranged in the periphery of the macro at contact C1 and contact C2. Due to the limitation on the wiring direction of the wiring layer, the wiring in the lateral direction is different from the wiring in the vertical direction. Therefore, the lateral direction of the power supply ring is indicated by the area having closely-spaced hatch marks, while the vertical direction of the power supply ring is indicted by the area having larger-spaced hatch marks.

In the power supply ring, the wiring in the vertical direction is connected with the wiring in the lateral direction at contact C3 and contact C4. The contact C1 and contact C3 must be arranged such that a certain distance is maintained among these contacts to assure the reliability of the chip. The same requirement applies to contact C2 and contact C4. Therefore, if the side of the macro nearer to the chip center overlaps the fixed power supply wiring, a space may be generated between the side of the macro nearer to the chip center and the power supply ring, as illustrated in FIG. 24C. Accordingly, when the macro is moved toward the chip center so that the side of the macro nearer to the chip center, overlaps the side of the fixed power supply wiring nearer the chip center, as illustrated in FIG. 24D, the space explained above can be reduced to enhance integration density of the chip.

Macro Movement (5), Operation 25

Figure 25:
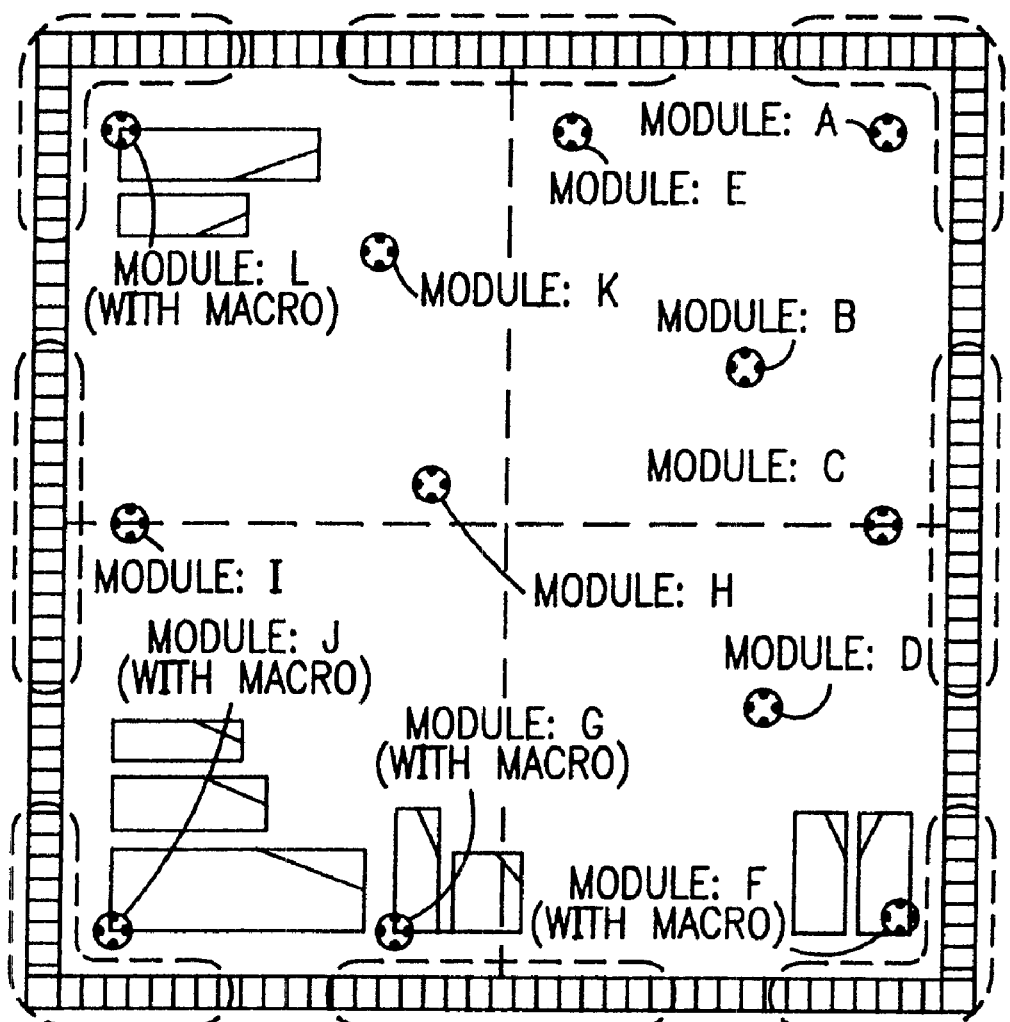
FIG. 25 illustrates macro movement ⑤) on a semiconductor chip.

FIG. 25 illustrates a practical example of macro movement (5), operation 25 of FIG. 20. In macro movement (5), a macro is moved to eliminate overlap among macros. If overlap among the macros is generated with the process of macro movement (4), operation 24 of FIG. 20, a macro is moved to eliminate the overlap.

Figure 26:
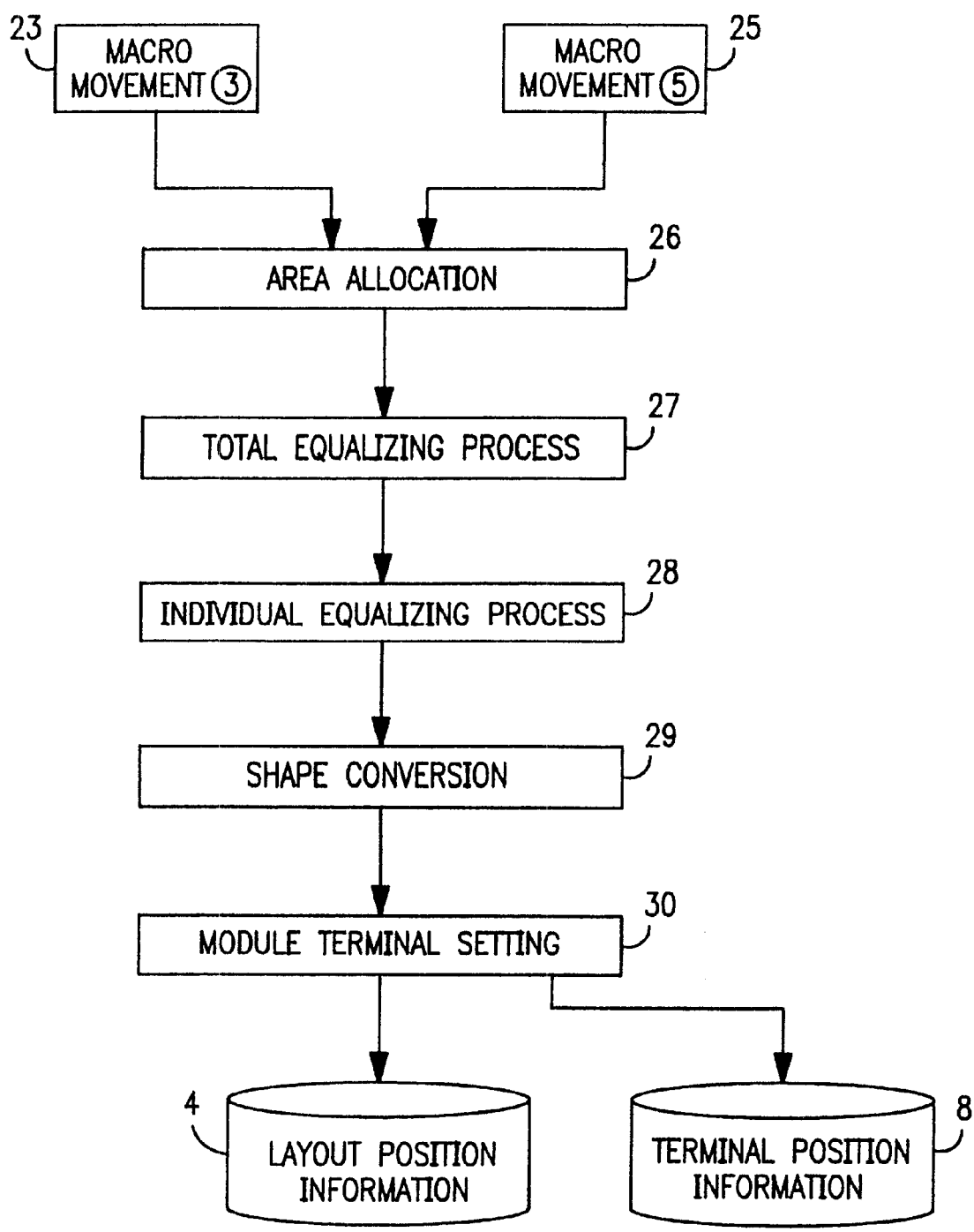
FIG. 26 is a flow diagram illustrating a semiconductor design method according to a third embodiment of the present invention.

FIG. 26 illustrates a semiconductor design system according to a third embodiment of the present invention. The third embodiment of the present invention relates to the process to be conducted when a size of a module is defined. Moreover, the third embodiment of the present invention is also performed after completion of the process of the first embodiment or after completion of the process of the second embodiment.

Area Allocation, Operation 26

Figure 27:
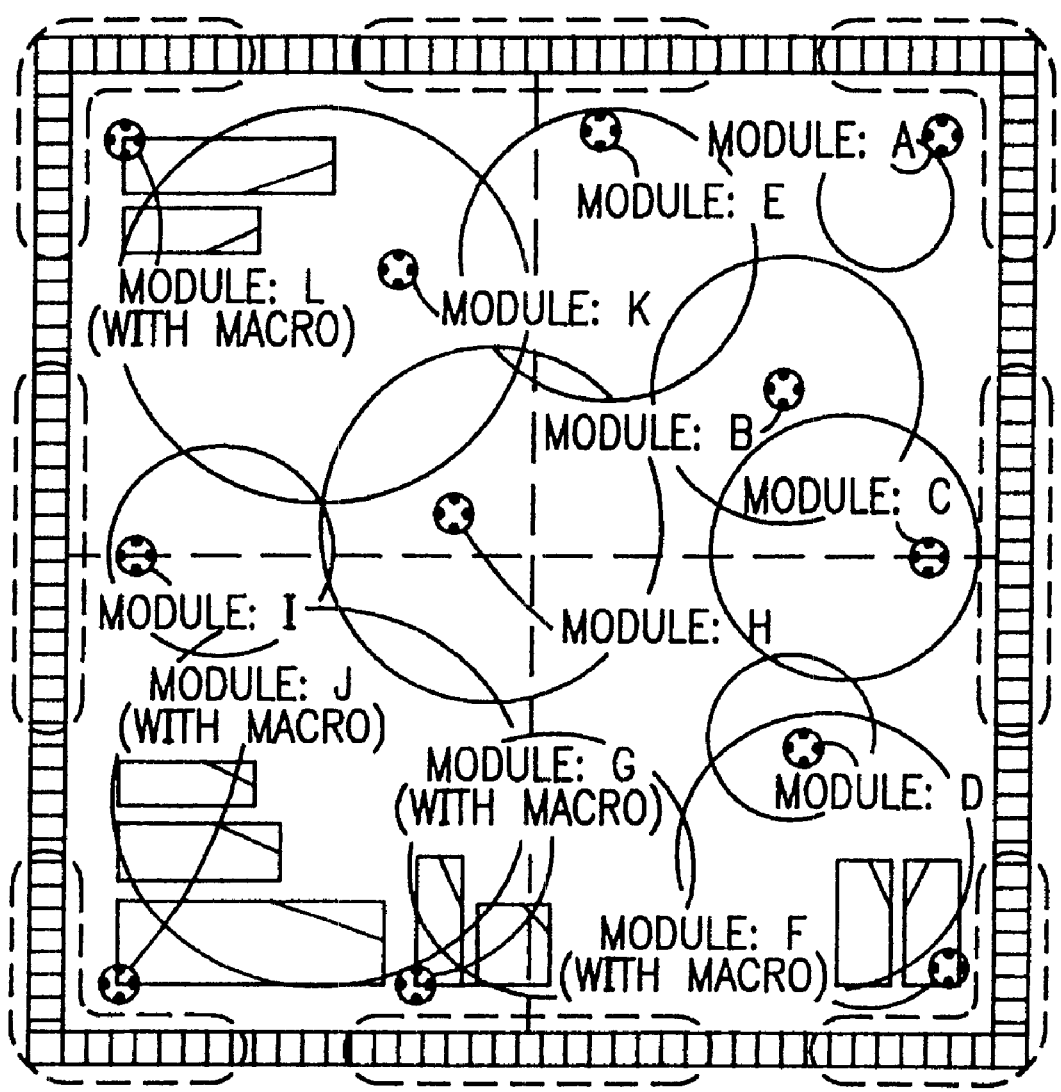
FIG. 27 illustrates area allocation of macros and modules on a semiconductor chip.

FIG. 27 illustrates a practical example of area allocation, operation 26 of FIG. 26. In the area allocation 26, area is allocated to a module. When a size of a module (i.e. number of areas) is defined in the design information 1, the module layout considering the size of the module can be realized.

A circle having an area proportional to the size (number of areas) is allocated for each module. The center of the circle is located at the module coordinates as the center, but a circle contacts a side of the chip is allocated to a module within the boundary of the chip sides.

Total Equalizing Process, Operation 27

Figure 28:
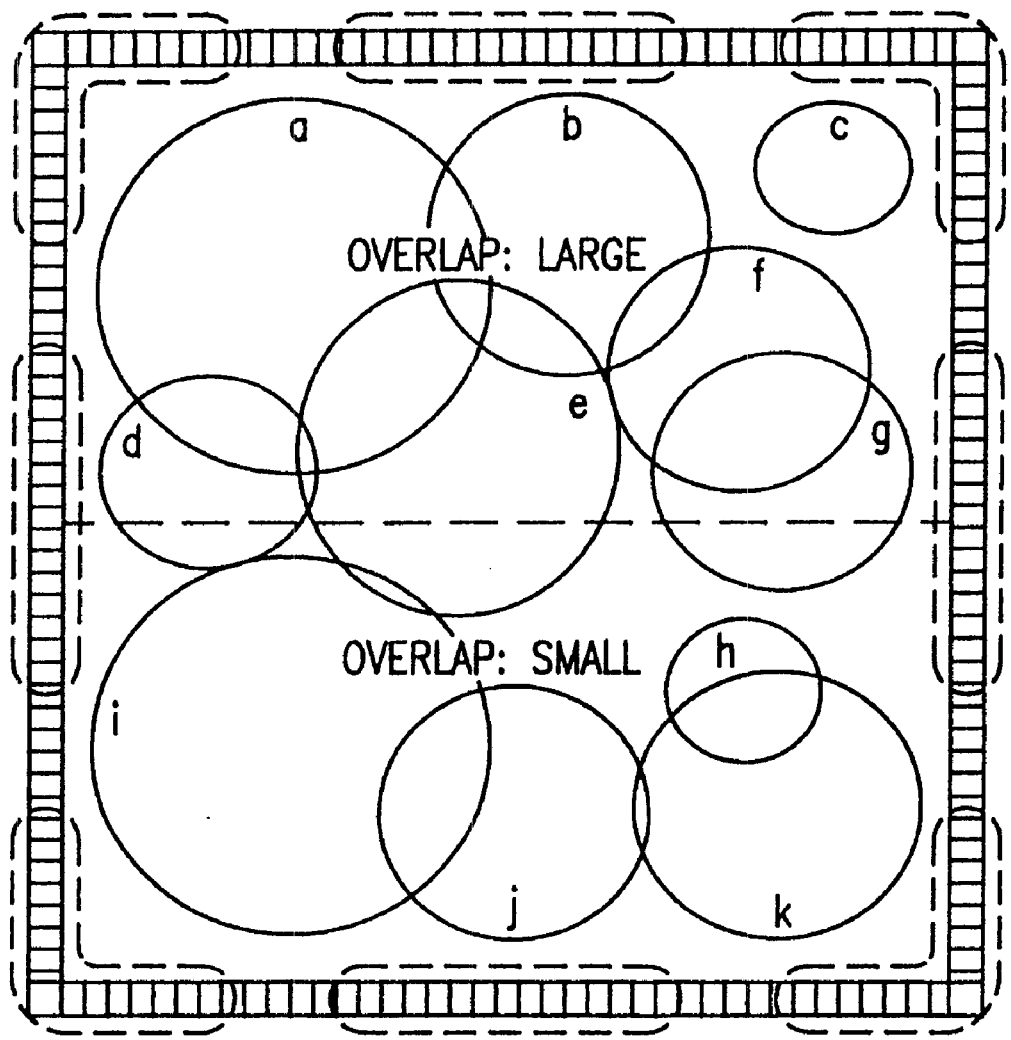
FIG. 28 illustrates a total equalizing process according to an embodiment of the present invention.

FIG. 28 illustrates a practical example of a total equalizing process, operation 27 of FIG. 26. In the total equalizing process 27, a chip is divided into a plurality of areas to equalize the overlap of the areas of the modules.

A chip is divided into a plurality of areas to obtain overlap of module areas in each divided area. In the divided area in which overlap of module area is rather large, a module is moved toward the adjacent divided area under the condition that the position of a module located along the side of the chip is fixed and the coordinate system is expanded. In the divided area in which overlap of module area is rather small, a module is moved toward the chip side under the condition that position of module located along the chip side is fixed and the coordinate system is reduced. With movement of a module in each divided area as explained above, overlap of module area is reduced in the divided area where module area overlap is rather large, and overlap of module area in the divided area where module area overlap is rather small is enlarged. Therefore, the rate of module area overlap can be equalized in the chip as a whole.

In FIG. 28, the chip is divided into two sections, i.e. an upper section and a lower section. Area overlap is larger in the upper section of the chip than in the lower section of the chip. Therefore, in the upper section, the modules "d," "e," "f" and "g" are moved in the lower direction based on the ratio of area overlap, while the positions of modules "a," "b" and "c" located along the chip side are fixed. Here, the ratio of area overlap unit a rate of the total sum of overlap areas in the upper area and the total sum of overlapped areas in the lower section. Moreover, in the lower section, the module "h" is moved in the lower direction based on the rate of area overlap, while the positions of modules "i," "j" and "k" located along the chip side are fixed.

The chip may also be divided freely, and it may also be divided into two portions in the lateral direction (i.e., the right and left side of the chip).

Individual Equalizing Process, Operation 28

In an individual equalizing process, operation 28 of FIG. 26, area overlap of modules is individually equalized. In the total equalizing process, operation 27 of FIG. 26, the overlapping areas of all modules of the chip are equalized. Therefore, individual modules have larger area overlap in some cases. In the individual equalizing process 28, area overlap is reduced for individual modules.

Figure 29A:
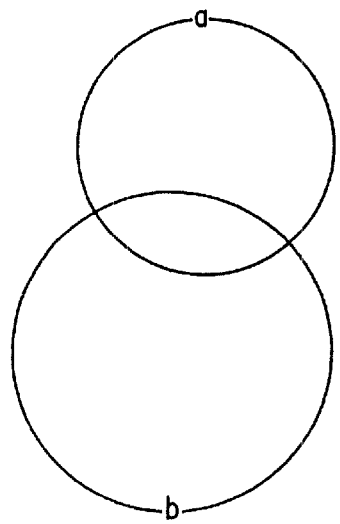
FIGS. 29A and 29B are respective schematic illustrations of an individual equalizing process.
Figure 29B:
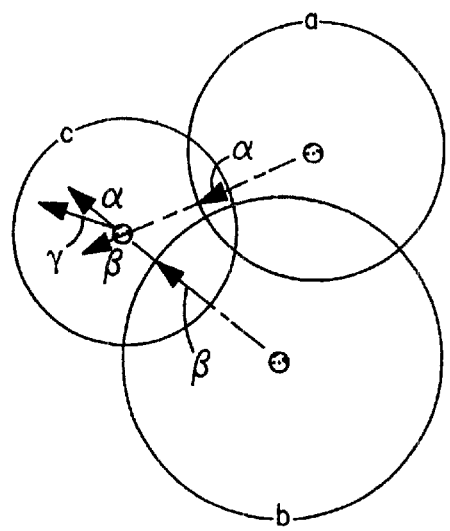

FIG. 29A and FIG. 29B illustrate practical examples of the individual equalizing process 28. FIG. 29A illustrates the case where the modules "a" and "b" contact the side of the chip. The overlap of modules "a" and "b" is reduced by moving module "a" in the upper direction while maintaining contact with the side of the chip, or by moving module "b" in the lower direction, or by moving module "a" in the upper direction and the module "b" in the lower direction.

FIG. 29B illustrates the case where modules "a" and "b" contact the side of the chip and module "c" overlaps modules "a" and "b." Here, a position vector ($\gamma$) is obtained, which is the sum of the position vector ($\alpha$) and the position vector ($\beta$). The direction of the position vector ($\gamma$) is from the module "a" to the module "c," and the size of the vector is the overlap of modules "a" and "c." The direction of the position vector ($\beta$) is from the module "b" to the module "c," and the size of the vector is the overlap of modules "b" and "c." The module "c" is moved to this position vector ($\gamma$) to reduce the overlap of modules "a" and "c" and the overlap of modules "b" and "c." With the method of FIG. 29B, individual overlap of modules can be reduced.

Shape Conversion, Operation 29

In shape conversion 29, Operation 29 of FIG. 26, a target circular module is converted to another shape. When a module has a circular shape, useless space is generated between the adjacent modules and, therefore, the shape of the module is converted from the circular shape to a square shape.

Figure 30A:
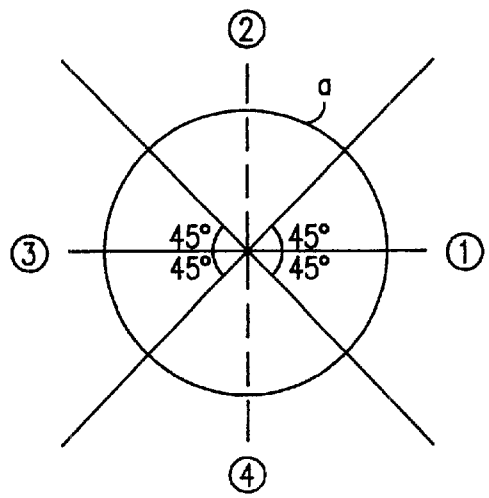
FIGS. 30A, 30B and 30C are respective schematic illustrations of shape conversion on a semiconductor chip.
Figure 30B:
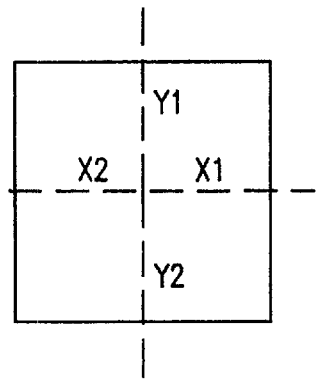
Figure 30C:
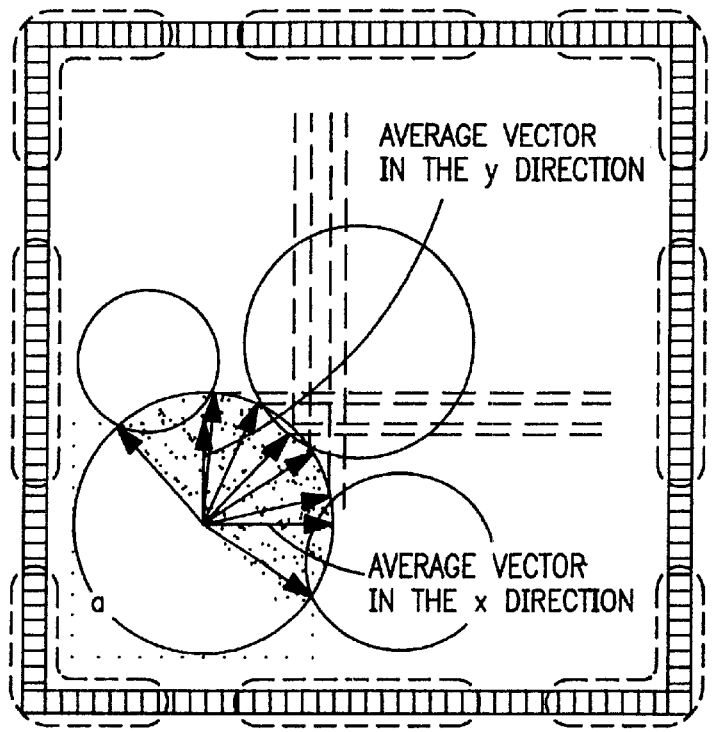

FIG. 30A, FIG. 30B and FIG. 30C illustrate practical examples of the shape conversion 29. In FIG. 30A, a module "a" is divided at 90° angles into four portions to form the area ①, area ②, area ③ and area ④ to determine the size of each side of a square shape of module "a." In area ①, distances between the center of module a and the points where module "a" crosses the other modules are all obtained and the mean value of these distances is obtained as X1. Similar processes are conducted for area ②, area ③ and area ④ to obtain Y1, X2 and Y2, respectively. Using the values of X1, X2, Y1 and Y2 obtained as explained above, the square having the size as illustrated in FIG. 30B is formed.

In FIG. 30C, the circular module "a" is converted to a square-shaped module with the method explained above. In FIG. 30C, because module "a" is arranged at the corner of the chip, it is not necessary to obtain x2 for area ③ and y2 for area ④. When the module is in contact with the chip side in any area among the areas ①, ②, ③, and ④, the distance between the center of the module and the contact point of the chip side is equal to half the length of the square shape in the relevant area, and therefore the calculation indicated in FIG. 30A is not required.

When the circular module is converted to the square shape as illustrated in FIG. 30C, useless space can be reduced to improve integration density of the chip. The module shape information 9 (see FIG. 1) of the module is stored in a file and used for the layout wiring process.

Module Terminal Setting, Operation 30

Figure 31:
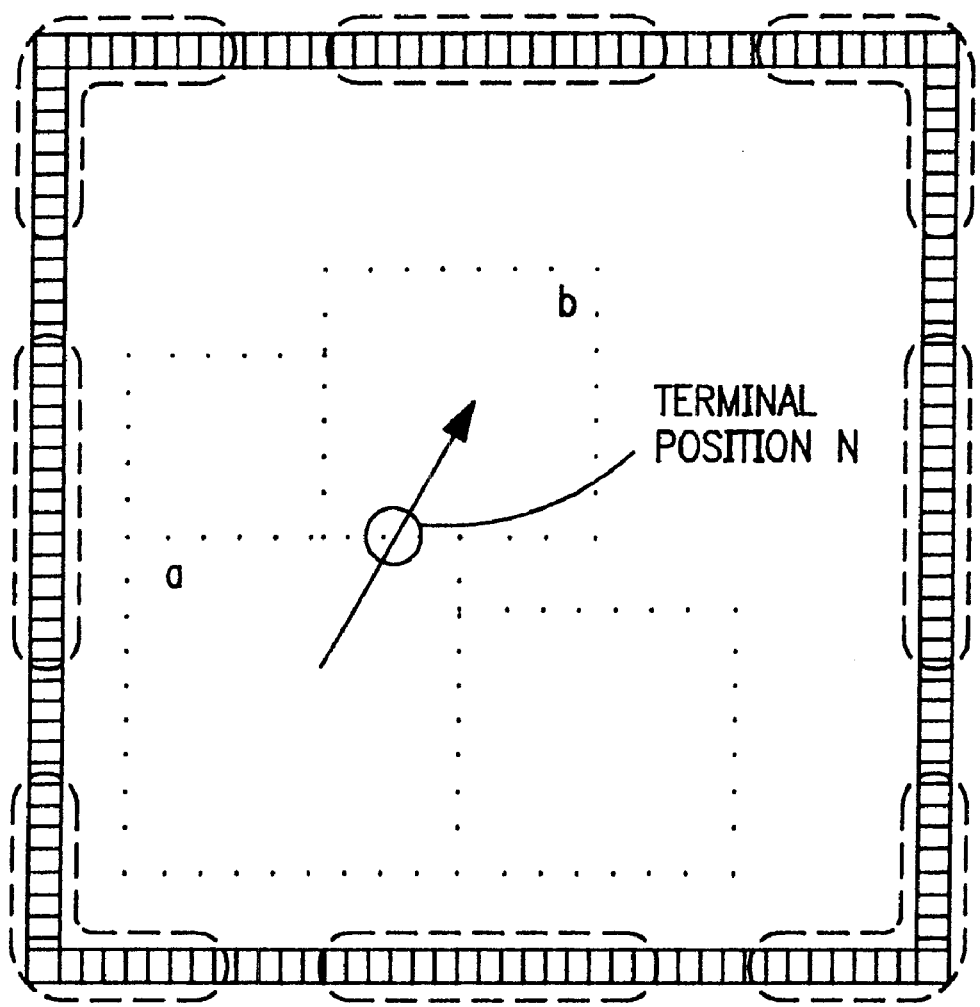
FIG. 31 is an illustration of a module terminal setting on a semiconductor chip.
Figure 32:
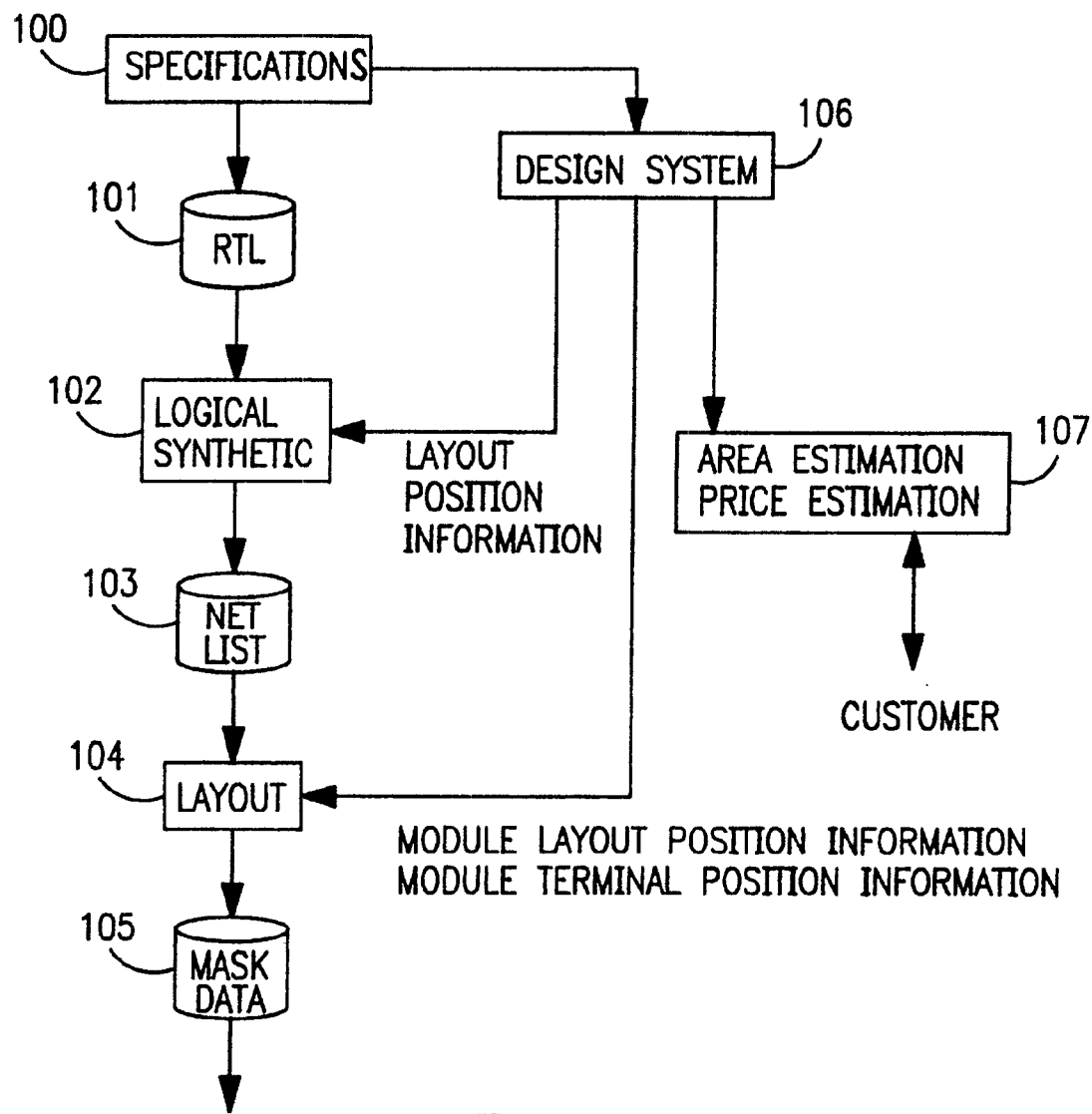
FIG. 32 is a flow diagram illustrating an effect of the present invention.

FIG. 31 illustrates a practical example of a module terminal setting, operation 30 of FIG. 26. In the module terminal setting, the terminal position of the module is determined. After the shape of the module is determined, position of the input/output terminals of module can be determined.

Each input/output terminal is placed where the sides of the modules contact one another. In FIG. 31, the terminal position N for connecting the modules "a" and "b" is set. The terminal position information 8 is stored in a file and used for the layout wiring process as the limitation on the layout of input/output cells in the module.

Although a few preferred embodiments of the present invention have been illustrated and described, it will be appreciated by those skilled in the art that changes may be made in these embodiments without departing from the principles and spirit of the invention, the scope of which is defined in the claims and their equivalents.

What is claimed is:

1. A semiconductor design system to enhance layout on a semiconductor chip, comprising:
a determining unit determining a layout position of a module on a semiconductor chip before generation of an RTL description based on design information including information for connecting an external circuit to the module and information for interconnecting the module to other modules, macro information corresponding to a macro within the module and chip information corresponding to the semiconductor chip.

2. The semiconductor design system according to claim 1, further comprising:
a module moving unit moving the module having the associated macro to an area near a side of the semiconductor chip.

3. The semiconductor design system according to claim 1, wherein the design information further comprises information about a size of the module, and the module layout position is determined by considering the size of the module.

4. The semiconductor design system according to claim 1, wherein an input/output pad of the semiconductor chip is divided into a plurality of pad allocation areas.

5. The semiconductor design system according to claim 4, wherein the determining unit generates information of a terminal position for connecting modules.

6. The semiconductor design system according to claim 1, wherein other macros included in the module are allocated with a longest side length macro disposed toward a side of the semiconductor chip and remaining macros sequentially disposed toward chip center in order of macro length.

7. The semiconductor design system according to claim 6, wherein the chip is divided into four areas, with each area having an associated corner of the chip, and wherein the module having the longest sided macro among the modules in each area is allocated at a corresponding corner of the chip.

8. The semiconductor design system according to claim 6, wherein layout is determined so that a side of a macro included in the macro is disposed with signal terminals directed toward chip center.

9. The semiconductor design system according to claim 6, wherein the same type of macros within the module are disposed with signal terminals opposed to each other when arranged adjacently.

10. The semiconductor design system according to claim 6, wherein interval spacing between macros is adjusted considering the number of wiring layers, wiring direction of wiring layer or wiring interval of wiring layer.

11. The semiconductor design system according to claim 6, wherein the macro is moved to avoid overlap with fixed power supply wiring.

12. A semiconductor design system for designing before generation of an RTL description, comprising:
a module initial layout unit allocating a module to an initial predetermined position on a semicondutor chip;
a first module moving unit moving the module to an area closer to a pad allocating area of a plurality of pad allocation areas based on information for connecting an external circuit and the module;
a second module moving unit moving the module based on information of connecting the module with at least one of a plurality of other modules;
a third module moving unit moving modules having a macro to areas near a side of the chip;
a macro layout unit allocating macros to corresponding areas within each module; and
a macro moving unit moving a macro within each module to remove macro overlap.

13. The semiconductor design system according to claim 12, further comprising:
a first macro rotating unit rotating macros based on macro signal terminal positions.

14. The semiconductor design system according to claim 12, further comprising:
a second macro rotating unit rotating macros to use common signal lines among adjacent macros.

15. A semiconductor integrated circuit, comprising:
a plurality of grouped macros allocated with a longest side length macro disposed toward a side of a semiconductor chip and remaining macros sequentially disposed toward chip center in order of macro length.

16. The semiconductor integrated circuit according to claim 15, wherein the chip is divided into four areas, with each area having an associated corner of the chip, and wherein the module having the longest sided macro among the modules in each area is allocated at a corresponding corner of the chip.

17. The semiconductor integrated circuit according to claim 15, wherein layout is determined so that a side of a macro included in the module is disposed with signal terminals directed toward chip center.

18. The semiconductor integrated circuit according to claim 15, wherein the same type of macros within a module are disposed with signal terminals opposed to each other when arranged adjacently.

19. A storage medium storing a semiconductor design program to enhance layout on a semiconductor chip, comprising:

retrieving design information comprising information for connecting an external circuit to a module and information for interconnecting the module to other modules, macro information corresponding to a macro within the module and chip information corresponding to the semiconductor chip; and determining a layout position of the module on the semiconductor chip based on the retrieved information.

20. The storage medium storing a semiconductor design program according to claim 19, further comprising:

allocating a module including macros in an area near a side of the chip.

21. The storage medium storing a semiconductor design program according to claim 19, wherein the design information includes information about module size, and wherein module layout position is determined considering the module size.

22. A method of designing layout on a semiconductor chip, comprising:

retrieving design information comprising information for connecting an external circuit to a module and information for interconnecting the module to other modules, macro information corresponding to a macro within the module and chip information corresponding to the semiconductor chip; and determining a layout position of the module on the semiconductor chip based on the retrieved information.

23. A method of designing layout on a semiconductor chip before generation of an RTL description, comprising:

allocating a module to an initial predetermined position on a semiconductor chip;

moving the module to an area closer to a pad allocating area of a plurality of pad allocation areas based on information for connecting an external circuit and the module;

moving the module based on information of connecting the module with at least one of a plurality of other modules;

moving modules having a macro to areas near a side of the chip;

allocating macros to corresponding areas within each module; and moving a macro within each module to remove macro overlap.

24. A semiconductor chip design system for determining layout of a plurality of modules on a semiconductor chip before generation of an RTL description, the chip having an input/output pad divided into a plurality of pad allocation areas and modules positioned on the chip at predetermined locations, the semiconductor chip design system comprising:

a module layout unit moving each of the modules on the chip based on design information for connecting each of the modules to corresponding pad allocation areas and other modules, and moving each module having one or more associated macros to a side of the chip; and a macro layout unit positioning macros within the moved modules such that macros of each moved module do not overlap.

25. The semiconductor chip design system according to claim 24, wherein said macro layout unit arranges the macros within each moved module in a sequence according to the lengths of the macros, from longest to shortest, with the longest macro being positioned toward a side of the chip and the shortest macro being positioned toward the center of the chip.

26. The semiconductor chip design system according to claim 25, said module layout unit dividing the chip into four areas, each of the areas containing a corner of the chip, and arranging a module having the longest macro within each area near the corresponding corner of the chip.

27. The semiconductor chip design system of claim 24, wherein a macro within the moved modules has a side containing a plurality of signal terminals being positioned such that the side having the plurality of signal terminals is directed toward the center of the chip.

28. The semiconductor chip design system of claim 24, wherein a macro within the moved macros is moved when a fixed power supply wiring and the macro overlap.

29. A semiconductor chip design system, comprising:

a storage storing chip design information; and a computer receiving the chip design information and moving each of modules on a chip based on the received chip design information, the chip design information instructing connecting each of the modules to corresponding pad allocation areas and other modules, moving each module having one or more associated macros to a side of the chip, and positioning the macros within the moved modules without overlapping macros of other modules.

30. The semiconductor chip design system according to claim 29, wherein said computer rotating the macros within the moved modules based on positions of signal terminals of the macros.

31. The semiconductor chip design system according to claim 29, wherein, when two adjacent macros within each moved module have the same type and the two adjacent macros have a side with a plurality of signal terminals, said computer positions the adjacent macros such that the sides of the macros having the plurality of signal terminals face one another.

32. The semiconductor chip design system of claim 29, wherein said computer rotates adjacent macros within the moved modules when the adjacent macros use a common signal.

* * * * *

UNITED STATES PATENT AND TRADEMARK OFFICE
CERTIFICATE OF CORRECTION

PATENT NO.    : 6,625,792 B1
DATED         : September 23, 2003
INVENTOR(S)   : Kazuhito Yamasaki It is certified that error appears in the above-identified patent and that said Letters Patent is hereby corrected as shown below:

<u>Column 17,</u>
Lines 24-25, change "on the semiconductor chip based on the retrieved information" to -- , before generation of an RTL description, based on design information including information for connecting an external circuit and the module and information for connecting the module to other modules, macro information and chip information --; and
Lines 44-45, change "on the semiconductor chip based on the retrieved information" to -- , before generation of an RTL description, based on design information including information for connecting an external circuit and the module and information for connecting the module to other modules, macro information and chip information --

Signed and Sealed this

Twenty-fourth Day of February, 2004

JON W. DUDAS
*Acting Director of the United States Patent and Trademark Office*